(12) United States Patent
Majima et al.

(10) Patent No.: US 9,595,604 B2
(45) Date of Patent: Mar. 14, 2017

(54) ELECTRONIC ELEMENT

(71) Applicant: JAPAN SCIENCE AND TECHNOLOGY AGENCY, Kawaguchi-shi, Saitama (JP)

(72) Inventors: Yutaka Majima, Yokohama (JP); Toshiharu Teranishi, Uji (JP); Yasuo Azuma, Yokohama (JP); Masanori Sakamoto, Uji (JP); Shinya Kano, Yokohama (JP); Daniel Eduardo Hurtado Salinas, Yokohama (JP)

(73) Assignee: JAPAN SCIENCE AND TECHNOLOGY AGENCY, Kawaguchi-shi (JP)

( * ) Notice: Subject to any disclaimer, the term of this patent is extended or adjusted under 35 U.S.C. 154(b) by 0 days.

(21) Appl. No.: 14/773,547

(22) PCT Filed: Mar. 9, 2014

(86) PCT No.: PCT/JP2014/056080
§ 371 (c)(1),
(2) Date: Sep. 8, 2015

(87) PCT Pub. No.: WO2014/142040
PCT Pub. Date: Sep. 18, 2014

(65) Prior Publication Data
US 2016/0020311 A1    Jan. 21, 2016

(30) Foreign Application Priority Data

Mar. 9, 2013   (JP) ................ 2013-047422

(51) Int. Cl.
*H01L 29/76*   (2006.01)
*B82Y 10/00*   (2011.01)
(Continued)

(52) U.S. Cl.
CPC .......... *H01L 29/7613* (2013.01); *B82Y 10/00* (2013.01); *G11C 7/00* (2013.01);
(Continued)

(58) Field of Classification Search
CPC ............... H01L 29/7613; H01L 29/127; H01L 29/0665; B82Y 10/00
See application file for complete search history.

(56) References Cited

U.S. PATENT DOCUMENTS 5,315,131 A * 5/1994 Kishimoto ........... G06N 3/0635
                                                          257/212
7,145,793 B1* 12/2006 Bulovic ................. B82Y 10/00
                                                          257/E29.17
(Continued)

FOREIGN PATENT DOCUMENTS

JP    2005-286084 A   10/2005
JP    4119950 B2       5/2008
(Continued)

OTHER PUBLICATIONS

International Search Report dated Apr. 22, 2014, issued in counterpart Application No. PCT/JP2014/056080 (2 pages).
(Continued)

*Primary Examiner* — Allison P Bernstein
(74) *Attorney, Agent, or Firm* — Westerman, Hattori, Daniels & Adrian, LLP

(57) ABSTRACT

Provided is an electronic element that functions as a switch or memory without using metal nanoparticle. The electronic element includes: one electrode 5A and an other electrode 5B arranged to have a nanogap therebetween; and halide ion 6 provided between the electrodes 5A and 5B; and on one of the electrodes.

4 Claims, 29 Drawing Sheets

(51) Int. Cl.
  H01L 29/12    (2006.01)
  H01L 29/06    (2006.01)
  H01L 29/41    (2006.01)
  H01L 51/00    (2006.01)
  G11C 7/00     (2006.01)
(52) U.S. Cl.
  CPC ........ *H01L 29/0665* (2013.01); *H01L 29/127* (2013.01); *H01L 29/413* (2013.01); *H01L 51/0098* (2013.01)

(56) References Cited

U.S. PATENT DOCUMENTS

| | | | | |
|---|---|---|---|---|
| 7,419,849 B2* | 9/2008 | Kumagai | ............... | B82Y 10/00 257/E21.37 |
| 8,093,518 B2* | 1/2012 | Naitoh | ................... | H01L 45/04 200/267 |
| 2004/0089882 A1* | 5/2004 | Aono | ...................... | G11C 13/02 257/212 |
| 2005/0139819 A1* | 6/2005 | Hwang | .................. | B82Y 10/00 257/14 |
| 2009/0039330 A1 | 2/2009 | Naitoh et al. | | |
| 2009/0289371 A1 | 11/2009 | Sakamoto | | |
| 2014/0054788 A1* | 2/2014 | Majima | .................. | B82Y 10/00 257/773 |

FOREIGN PATENT DOCUMENTS

| | | |
|---|---|---|
| JP | 2008-311449 A | 12/2008 |
| WO | 2007/069725 A1 | 6/2007 |
| WO | 2012/121067 A1 | 9/2012 |
| WO | 2013/129535 A1 | 9/2013 |

OTHER PUBLICATIONS

Aoyama, et al., "2-bit Analog-to-Digital Converter by Chemically Assembled Single-Electron Transistors", The Japan Society of Applied Physics, (2013), pp. 1-3.
Hackenberger, et al., "Aluminum Oxide Passivated Chemically Assembled Single-Electron Transistors", 2013, The Japan Society of Applied Physics. (3 pages).
Azuma, et al., "Inelastic tunneling phenomena of [6,6]-Phenyl-C61-Butyric Acid Methyl Ester Introduced in Au Nanogap Electrode", (2013), pp. 1-3.
Serdio, et al., "Self-terminated Nanogap Electrodes by Electroless Gold Plating", 2014, The Japan Societ of Applied Physics, (3 pages).
Kano, et al., "Random Telegraph Signals by Alkanethiol-protected Au Nanoparticles in Chemically Assembled Single-electron Transistors", Journal of Applied Physics, 114, (2013); doi: 10.1063/1. 4847955. (7 pages).
Hackenberger, et al., "Silicon-Nitride-Passivated Bottom-Up Single-Electron Transistors", Japanese Journal of Applied Physics, 52, (2013), 110101. (5 pages).
Valladares, et al., "Reorientation Response of Magnetic Microspheres Attached to Gold Electrodes Under an Applied Magnetic Field", Brazilian Journal of Physics, ISSN 0103-9733, vol. 43, No. 4. (7 pages).
Choi, et al., "Fabrication and Characterization of Fully Flattened Carbon Nanotubes: A New Graphene Nanoribbon Analogue", Scientific Reports, vol. 3, No. 1617, DOI: 10.1038/srep01617. (5 pages).
Majima, "Electroless Plated Nanogap Electrodes and Their Device Applications", 26th International Microprocesses and Nanotechnology Conference, 2013. (6 pages).
Majima, "Bottom-up Single-Electron Transistors and Molecular Devices", ICFPE 2013, Jeju Island, Korea, Sep. 10-13, 2013. (4 pages).
Majima, "Room-Temperature Single Molecular Memory", The 24th International Conference on Molecular Electronics and Devices, IC ME&D 2013, http://new.kesnet.or.kr.ann_notice/13577. (4 pages).
Kobayashi, "Multistate Switching of Redox Active Unimolecular Device Based on Electroless Plated Gold Nanogap Electrodes", Ramanathan Naarajan, Mar. 16, 2014, 247th American Chemical Society National Meeting & Exposition. (3 pages).
Kawamoto, et al., "Cyano-Anchored Triptycene Self-assembled Monolayer on Au(111) Surface", P-019, KJF-ICOMEP, 2013, Busan Haeundae Grand Hotel, Aug. 28-31, 2013. (3 pages).
Azuma, et al., "Surface Potential of Hyper-branched Polystyrene Protected Au Nanoparticles Measured by Kelvin Force Microscopy", P-198, KJF-ICOMEP, 2013, Busan Haeundae Grand Hotel, Aug. 28-31, 2013. (4 pages).
Kawamoto, et al., "Tunneling Resistance of Porphyrin Ligand Protected Au Nanoparticle", 2014, The Japan Society of Applied Physics. (3 pages).
Hurtado, "Room Temperature Memory Operation in a Solid-State Device Based on Thiol-Functionalized Oligo (Phenylene-Ethynylene)-Protected Gold Nanoparticles", 2013, The Japan Society of Applied Physics, (3 pages).
Serdio, et al., "Electroless Gold Plating Processes for the Fabrication of Nanogap Electrodes", STAC-7 Seventh International Conference on Science and Technology of Advanced Ceramics, Jun. 19-21, 2013, (5 pages).
Onuma, et al., "Vertical Asymmetric Nanogap Elecrodes Fabricated by Electroless Gold Plating (EGP)", 2014, The Japan Society of Applied Physics, (3 pages).
Aoyama, et al., "Relationship Between Density of Nanogap Electrodes and Growth Velocity of Electroless Gold Plating", 2014, The Japan Society of Applied Physics. (3 pages).
Kawamoto, et al., "3 CN Anchored Triptycene SAM on Au(111)", 2013, The Japan Society of Applied Physics, (3 pages).
Majima, "Single Electron Transistor made by Bottom-UP Method", Parity, vol. 28, No. 05 (2013) (4 pages).
Azuma, et al., "Molecular Devices Consisting of [6,6]-Phenyl-C61-Butyric Acid Methyl Ester and Electroless Plated An Nanogap Electrodes", STAC-7 Seventh International Conference on Science and Technology of Advanced Ceramics, Jun. 19-21, 2013, (5 pages).
Koo, et al., "Stochastic Switching of Thiol-Functionalized Oligo(Phenylene-Ethynylene)-Protected Au Nanoparticles", The Japan Society of Applied Physics, 2013, (3 pages).
Takeshita, et al., Cross-Sectional Observation of Nanogap Electrodes Fabricated by Molecular Ruler Electroless Gold Plating (MoREP), 2013, The Japan Society of Applied Physics. (3 pages).
Majima, et al., "Negative Differential Resistance by Molecular Resonant Tunneling between Neutral Tribenzosubporphine Anchored to a Au(111) Surface and Tribenzosubporphine Cation Adsorbed on to a Tungsten Tip", Journal of the American Chemical Society, 2013, vol. 135, pp. 14159-14166.

* cited by examiner

MoREP electrodes using LTAB molecules.

*MoREP electrodes using LTAB molecules.*

ELECTRONIC ELEMENT

TECHNICAL FILED

The present invention relates to an electronic element having a switching function or a memory function.

BACKGROUND OF ART

An electric element has been developed, the element having the bridge, nano-wire or point-contact etc. placed between the opposing electrodes (patent literature 1 for example). Meanwhile, to establish manufacturing technology for the single electron transistor, the inventors have focused on a gold nanoparticle as Coulomb island in single-electron device, and used STM and clarified that the gold nanoparticle with particle diameter of 1.8 nm functioned as Coulomb island at ambient temperature. In addition, to construct an electronic device on solid substrate, the inventors used electroless plating and established the method for manufacturing nanogap electrodes with a gap separation of 5 nm at a high yield rate at a time. Furthermore, the inventors reported on function of the single electron transistor, in which the gold nanoparticle protected by the alkanethiol molecule was placed between the nanogap electrodes by chemical adsorption (Non-Patent Literatures 1 to 5).

CITATION LIST

Patent Literature

Patent literature 1: JP4119950B

Non-Patent Literature

Non-patent literature 1: S. Kano, Y. Azuma. M. Kanehara, T. Teranishi, Y. Majima, Appl. Phys. Express, 3, 105003 (2010)
Non-patent literature 2: Y. Yasutake, K. Kono, M. Kanehara, T. Teranishi, M. R. Buitelaar, C. G. Smith, Y. Majima, Appl. Phys. Lett., 91, 203107 (2007)
Non-patent literature 3: Victor M. Serdio V., Yasuo Azuma, Shuhei Takeshita, Taro Muraki, Toshiharu Teranishi and Yutaka Majima, Nanoscale, 4, 7161 (2012)
Non-patent literature 4: N. Okabayashi, K. Maeda, T. Muraki, D. Tanaka. M. Sakamoto. T. Teranishi, Y. Majima, Appl. Phys. Lett., 100, 033101 (2012)
Non-patent literature 5: Hiroshi Igawa. Satoshi Fujiwara. Yasuo Takahashi, Technical Report of IEICE, ED2001-241, SDM2001-250, Page 15 to 20,

SUMMARY OF INVENTION

Technical Problem

With such a single-electron transistor, however, it is necessary to arrange a metal nanoparticle protected by an alkanethiol molecule between a pair of nanogap electrodes. To achieve that objective, it is necessary to form a mixed self-assembled monolayer of alkanethiol and alkanedithiol, and chemically adsorbing metal nanoparticles by using the alkanedithiol as an anchor molecule, thereby introducing the metal nanoparticle between the nanogap electrodes. As described above, the method of manufacturing a single-electron transistor using the chemical adsorption method requires adding a process of forming a mixed self-assembled monolayer of alkanethiol and alkanedithiol and a process of introducing the metal nanoparticle described above, and consequently, the manufacturing process becomes complicated.

Therefore it is an object to the present invention to provide an electric element which functions as switch or memory without using a metal nanoparticle.

Solution to Problem

In order to achieve an object, the following means are taken in the present.

[1] An electronic element, comprising: one electrode and the other electrode provided to have a nanogap; a halide ion provided between the one electrode and the other electrode and on at least one of the electrodes.

[2] The electronic element as set forth in [1], wherein a waveform of electric current flowing between the one electrode and the other electrode is asymmetric when voltage between the one electrode and the other electrode is continuously varied from a positive value to a negative value and/or from a negative value to a positive value.

[3] The electronic element as set forth in [1], wherein current characteristics with respect to voltage between the one electrode and the other electrode have a negative differential conductance.

[4] The electronic element as set forth in [1], wherein a state of the halide ion is varied in accordance with a value of voltage that is applied between the one electrode and the other electrode so that an information-writing-state and an information-erasing-state are maintained in accordance with a value of electric current that flows between the one electrode and the other electrode.

Effects of Invention

According to the present invention, an electric element which functions as switch or memory can be provided even if a metal nanoparticle is not arranged between nanogap electrodes.

REFERENCE SIGNS LIST

Figure 1:
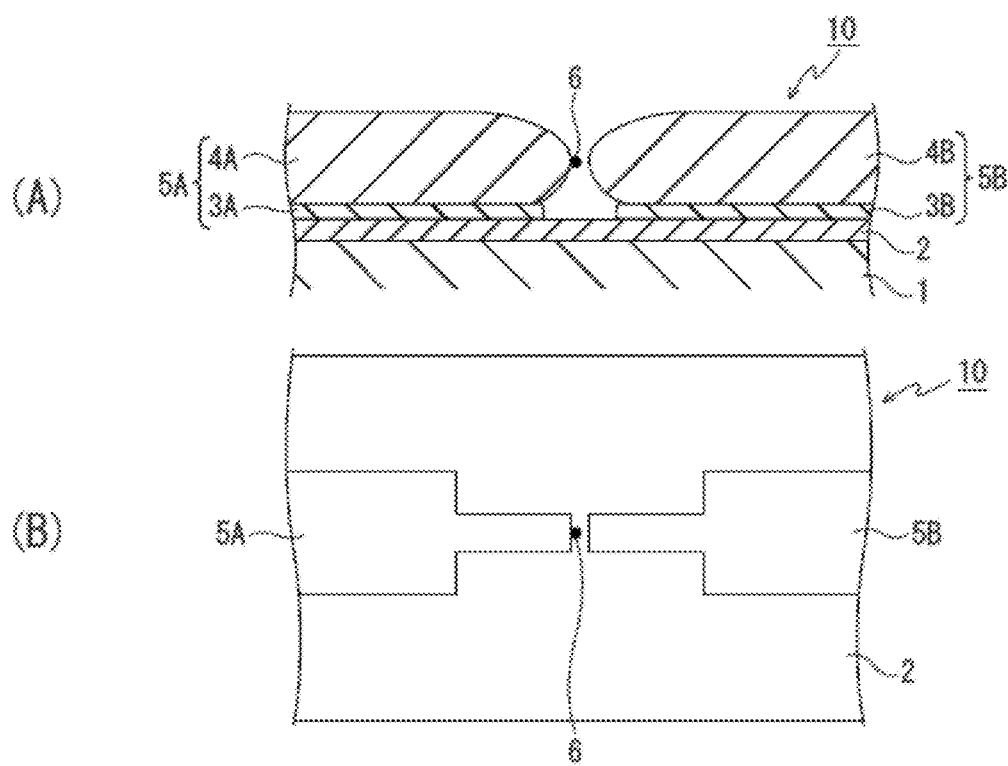
FIG. 1 shows the configuration of an electric element according to an embodiment where (A) is a section view and (B) is the plan view.

1: Substrate
2: First insulating layer
3A, 3B, 4A, 4B: Metal layer
5A: Nanogap electrode (one electrode)
5B: Nanogap electrode (the other electrode)
6: halide ion
10: electric element

DESCRIPTION OF EMBODIMENTS

The embodiments of the present invention will hereinafter be described by referring to the drawings. The embodiments of the present invention can be modified in various ways for use within the range of the invention indicated in the scope of the patent claims.

[Configuration of Electric Element]

FIG. 1 shows the configuration of an electric element according to an embodiment where (A) is a section view and (B) is the plan view. The electric element 10 according to an embodiment is provided with a substrate 1, an insulating layer 2 provided on the substrate 1, one electrode 5A and other electrode 5B provided so as to have a nanogap separation on the insulating layer 2, a halide ion(s) 6 provided between one electrode 5A and the other electrode 5B on at least one of the electrodes. The nanogap separation is several nm, for example, 2 nm to 12 nm. The one electrode 5A and the other electrode 5B constitute nanogap electrodes.

Various semiconductor substrates such as a Si substrate are used for the substrate 1. The insulating layer 2 is formed by $SiO_2$, $Si_3N_4$, etc.

The one electrode 5A and the other electrode 5B are formed by Au, Al, Ag, Cu, etc. The one electrode 5A and the other electrode 5B can be also formed by laying the adhesion layer 3A, 3B and the metal layer 4A, 4B one by one. The adhesion layer 3A. 3B is formed by Ti, Cr, Ni, etc. and the metal layer 4A. 4B is formed on the adhesion layer 3A, 3B by different or same metal such as Au, Al, Ag and Cu.

The halide ion(s) 6 is selected from among bromide ion, chloride ion, and iodide ion. The halide ion(s), which exists between the nanogap electrodes and contribute to electric conduction, are not placed by a uniform number onto the one electrode 5A and the other electrode 5B, but are placed by being deflected to one side.

[Characteristics of the Electronic Element]

Figure 2:
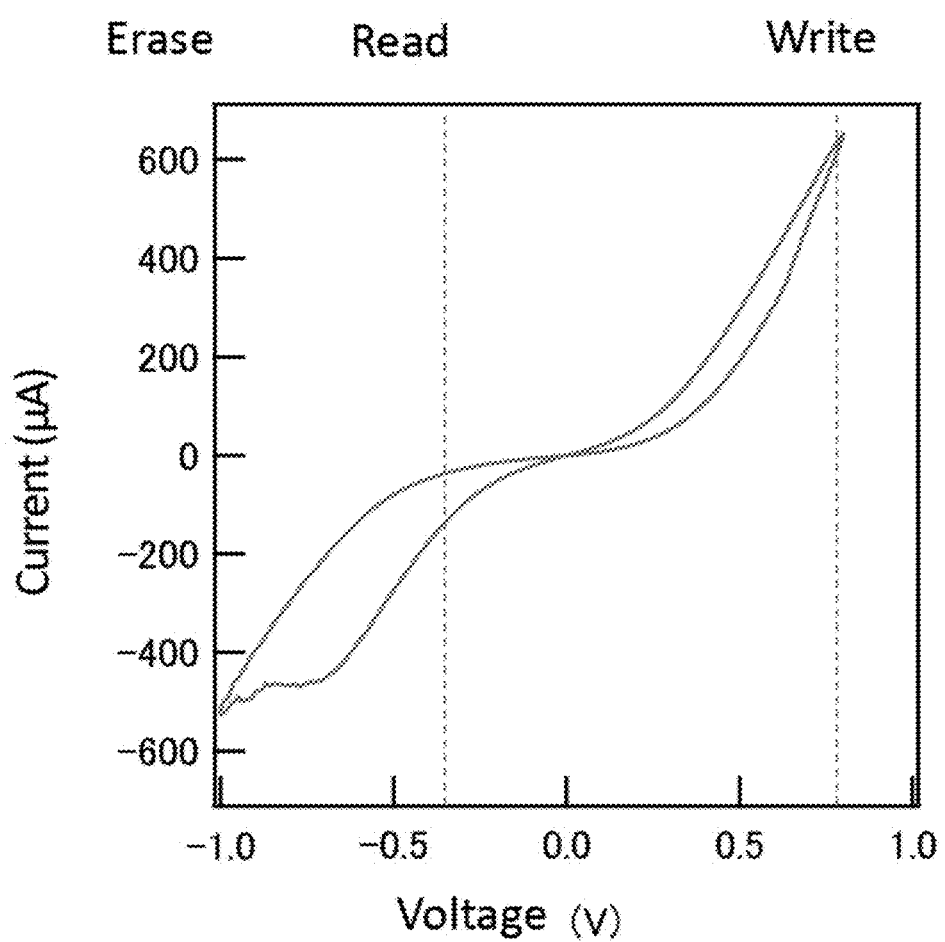
FIG. 2 is a view showing a current-voltage characteristics of the electronic element shown in FIG. 1.

Characteristics of the electronic element shown in FIG. 1 will be described. FIG. 2 shows current-voltage characteristics of the electronic element shown in FIG. 1. The horizontal axis represents voltage V (V), and the vertical axis represents current I (A). Voltage is applied between one electrode 5A and the other electrode 5B of the electronic element. In a state where the other electrode 5B is grounded, voltage is swept to the one electrode 5A. With the increase in positive bias, the current increases, and even if the positive bias is decreased after a certain voltage value is reached, the original current waveform is not restored. Meanwhile, with the increase in negative bias, a negative differential conductance region is entered when a certain voltage value is exceeded. In other words, when a certain negative bias is maintained, the state of a halide ion(s) 6 between the one electrode 5A and the other electrode 5B can be changed. As shown in FIG. 2, when the voltage is changed from a positive value to a negative value, or from a negative value to a positive value, or both, once or several times continuously, the current-voltage waveform of the electronic element 10 exhibits hysteresis Where the current waveform remains asymmetric, which indicates that adsorption of the halide ion(s) on the surface of either electrode causes the nanogap electrode structure contributing to electrical conduction to remain electrically asymmetric.

The reason why the current-voltage characteristics as shown in FIG. 2 can be obtained will be described.

The reason why the current-voltage characteristics as shown in FIG. 2 is obtained is considered to be as follows: by applying voltage between the nanogap electrodes, the valence of the halide ion existing in the gap changes. As a result, an oxidation-reduction reaction occurs, or the quantity of halide ions existing in the gap changes, and as a result, the quantity of halide ions that contribute to conduction changes, and the conductivity between the nanogap electrodes changes accordingly. The above is suggested by the fact that the quantity of halide ions existing between the nanogap electrodes, which will be described later, has impact on electrical conductivity. In addition, by applying voltage between the nanogap electrodes, ions may have undergone migration, thereby changing conductivity.

When write voltage, read voltage, and erase voltage are respectively represented as $V_{write}$, $V_{read}$, and $V_{erase}$ as the magnitude of voltage to be applied to one electrode 5A of the electronic element 10, each voltage is set so that the following expressions hold: write voltage $V_{write}<0<$read voltage $V_{read}<$erase voltage $V_{erase}$ or write voltage $V_{write}>0>$read voltage $V_{read}>$erase voltage $V_{erase}$. As a result, the electronic element 10 can be used as a memory element or as a switching element.

[Method for Fabricating the Electric Element]

Detailed explanation is made about a manufacturing method for the electric element shown in FIG. 1. First of all, the first insulating layer 2 is formed on the substrate 1. Subsequently, the nanogap electrodes 5A and 5B are formed by molecular-ruler electroless plating.

For example, the metal layers 3A and 3B are placed on the first insulating layer 2 so that the metal layers are separated in a pair and that a gap between the metal layers is wider than nanogap. Next the substrate 1 is dipped in an electroless plating solution. The electroless plating solution is fabricated by mixing an electrolyte solution including metal ions with a reducing agent and a surfactant. When the substrate 1 is dipped in the electroless plating solution, metal ions are reduced by the reducing agent and metal is precipitated on a surface of the metal layers 3A, 3B and turn into metal layers 4A. 4B. The gap between the metal layers 4A and 4B becomes narrow. The surfactant included in the electroless plating solution is chemically adsorbed on the metal layers 4A, 4B so that the surfactant controls a gap length (referred to as "gap separation") to be a nanometer size. Since the metal ions in the electrolyte solution are reduced by the reducing agent and metal is precipitated, this method is classified into an electroless plating method. Using this method, the metal layers 4A, 4B are formed on the metal layers 3A, 3B by plating to obtain a pair of electrodes 5A, 5B. Using the electroless plating method using surfactant molecules, i.e., protective group, as a molecular ruler (hereafter, referred to as "molecular ruler electroless plating method"), the molecular ruler controls the gap separation. At the same time, the material of the halide ions can be placed onto the nanogap electrodes 5A, 5B by various surfactants having halide ions as counter ions.

Then as a third step, by subjecting the nanogap electrodes to UV washing and/or $O_2$ plasma ashing, molecules having attached to the surface are made to undergo an ashing process. At that time, the counter ions of the surfactant adsorb to the one electrode 5A and/or the other electrode 5B, and by applying voltage to the one electrode 5A and the other electrode 5B, the state of the ions changes or the ions undergo migration, the both occur.

The electronic element 10 according to the embodiment of the present invention can thus be fabricated.

The second step will be fully described.

The mixed plating solution includes a surfactant serving as a molecular ruler and a solution in which precipitating positive metal ions are mixed, such as a gold trichloride acid solution, and a reducing agent. The mixed solution preferably includes some acids, as described later As a molecular ruler, for example, alkyltrimethylammonium bromide molecules, i.e., a surfactant, are used. Specifically, decyltrimethylammonium bromide (DTAB), lauryltrimethylammonium bromide (LTAB), myristyltrimethylammonium bromide (MTAB), cetyltrimethylammonium bromide (CTAB) are used as alkyltrimethylammonium bromide.

The molecular ruler is not limited to the above. Alkyltrimethylammonium halide, alkyltrimethylammonium chloride, alkyl trimethylammonium iodide, dialkyl dimethyl ammonium bromide, dialkyl dimethyl ammonium chloride, dialkyl dimethyl ammonium iodide, alkylbenzyldimethylammonium bromide, alkylbenzyldimethylammonium chloride, alkyl benzyl dimethyl ammonium iodide, alkylamine, N-methyl-1-alkyl-amine, N-methyl-1-dialkyl-amin, trialkyl amines, oleylamine, alkyl dimethyl phosphine, trialkyl phosphines, and alkylthiol, any one of these can be used. Further, a long chain aliphatic alkyl group is also not limited to alkyl group or alkylene group such as hexyl, octyl, decyl, dodecyl, tetradecyl, hexadecyl, octadecyl because the same effect is expected if it is a long chain aliphatic alkyl group.

As a molecular ruler, any one of the following other than DDAB (N,N,N,N',N',N'-hexamethyl-1,10-decandiammonium dibromide) may be used: hexamethonium bromide, N,N'-(1,20-icosanediyl)bis(trimethylaminium)dibromide, 1,1'-(decane-1,10-diyl)bis[4-aza-1-azoniabicyclo[2.2.2]octane]dibromide, propylditrimethylammonium chloride, 1,1'-dimethyl-4,4'-bipyridinium dichloride, 1,1'-dimethyl-4,4'-bipyridinium diiodide, 1,1'-diethyl-4,4'-bipyridinium dibromide, and 1,1'-diheptyl-4,4'-bipyridinium dibromide.

The electrolyte solution includes a gold trichloride acid solution, gold trichloride acid sodium solution, gold trichloride acid potassium solution, gold trichloride solution, and organic solvent in which gold trichloride acid ammonium salt is dissolved. The above ammonium salt can be used as ammonium salt, and as for the organic solvent, there are aliphatic hydrocarbon, benzene, toluene, chloromethane, dichloromethane, chloroform, carbon tetrachloride, and others.

The reducing agents include ascorbic acid, hydrazine, primary amine, secondary amine, primary alcohol, secondary alcohol, polyol (including diol), sodium sulfite, borohydride and hydroxylammonium chloride, lithium aluminum hydride, oxalic acid, formic acid, and others.

An acid with a comparatively weak reducing power, for example, ascorbic acid achieves a reduction to zero-valent gold by self-catalytic plating using the electrode surface as a catalyst. If an acid with a stronger reducing power is used, a reduction is made at other than electrodes to generate many clusters. In fact, it is not preferable because fine gold particles are generated in the solution and gold cannot be selectively precipitated on the electrodes. If an acid with a weaker reducing power is used, a self-catalytic plating reaction hardly occurs. Incidentally, cluster is a gold nanoparticle on which there is a core enabling electroless plating and formed on the core by plating.

L(+)-ascorbic acid is preferable to be used as a reducing agent because it has a weak reducing power among the above reducing agents to generate fewer clusters and to reduce the gold to zero valence using the electrode surface as a catalyst.

It is preferable to mix an acid to inhibit generation of cluster in the electroless plating solution because it can dissolve clusters in an unstable condition where the clusters are starting to form a core. Hydrochloric acid, nitric acid, acetic acid can be used.

Figure 3:
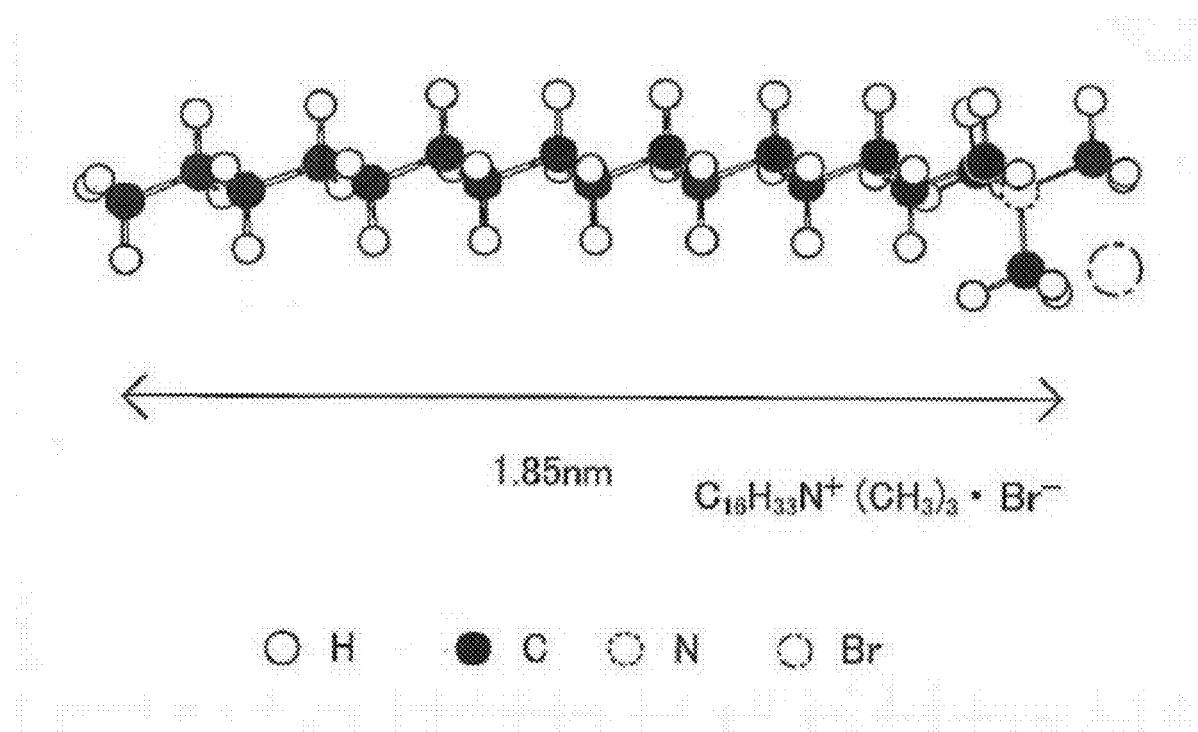
FIG. 3 is a view schematically showing a chemical structure of surfactant molecule (CTAB), used as a molecular ruler.

FIG. 3 is a view schematically showing a chemical structure of surfactant molecule (CTAB), used as a molecular ruler. CTAB is a C16 molecule, i.e., having an alkyl chain length of 16 straight chain carbons. The following four molecules are considered as one of the best embodiment: a derivative having a different alkyl chain. DTAB with an alkyl chain of C10, LTAB of C12, and MTAB of C14. These initial letters L. M, and C respectively stand for lauryl (12), myristyl (14), and cetyl (16).

In the above embodiments, gold is used for an electrode material but other metals may be used, for example, copper can be a material of initial electrodes. In that case, copper electrodes are formed as the initial electrodes using the EB lithography method or optical lithography method, and then the surface portion of the copper electrodes is turned into copper chloride. Then, a surface of the copper chloride is covered with gold using gold chloride solution including an ascorbic acid as a reducing agent in the plating solution.

Specifically, to mix a surfactant alkyltrimethylammonium bromide $C_nH_{2n+1}[CH_3]^3N^+.Br^-$ to a gold trichloride acid solution, and add a reducing agent L(+)-ascorbic acid to perform an autocatalytic electroless gold plating on the gap electrodes. Then, nanogap electrodes with a gold surface are fabricated using the molecular ruler plating method.

Example 1

As an example 1, an electric element is fabricated as follows using the molecular ruler electroless plating method.

First, a silicon substrate 1 on which a silicon dioxide film 2 is thoroughly provided is prepared. Then the substrate 1 is coated with resist and a pattern of initial electrodes, metal layers 3A. 3B with 30 nm gap separation, is drawn using the EB lithographic technology. After development, a 2 nm-Ti film is evaporated by EB (Electron Beam) evaporation and, on the Ti film, 10 nm Au is evaporated so that initial gold nanogap electrodes, metal layers 3A, 3B, are fabricated.

Next, an electroless plating solution is prepared. 28 milliliter of 25 millimole alkyltrimethylammonium bromide is measured to be used as a molecular ruler. Then, 120 microliter of 50 millimole chlorauric acid solution is measured and added therein. 1 milliliter acetic acid as an acid and 3.6 milliliter of 0.1 mol L(+)-ascorbic acid as a reducing agent are added therein, and all are well stirred to be used as a plating solution.

In the example 1, LTAB molecules are used as alkyltrimethylammonium bromide. The already fabricated substrate with gold nanogap electrodes is dipped in the electroless plating solution for about 30 minutes. Thereby, nanogap electrodes are fabricated using the molecular ruler electroless plating method in the example 1.

Then by performing oxygen plasma ashing, the straight chain of the LTAB used as a molecular ruler was removed, and the remaining counter ions were made to eccentrically exist in one of the nanogap electrodes.

Figure 4:
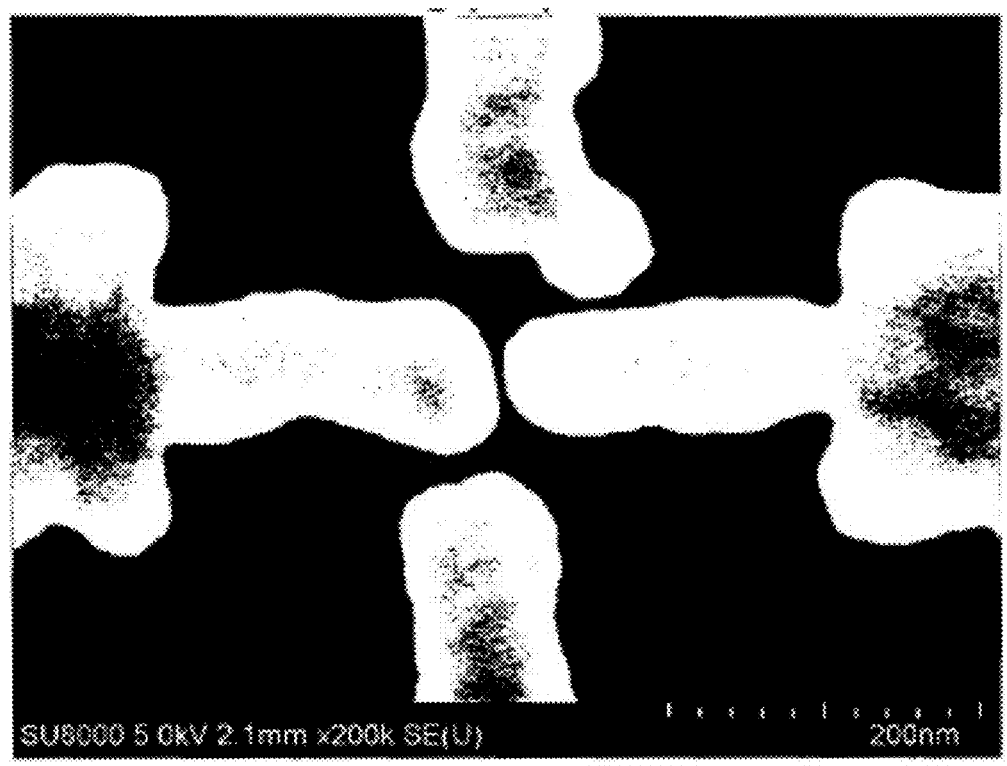
FIG. 4 is an SEM image of the sample fabricated in Example 1.

FIG. 4 is an SEM image of the sample fabricated in Example 1. The nanogap between the electrodes was 2.48 nm. In Example 1, side gates were fabricated at the same time.

Figure 5:
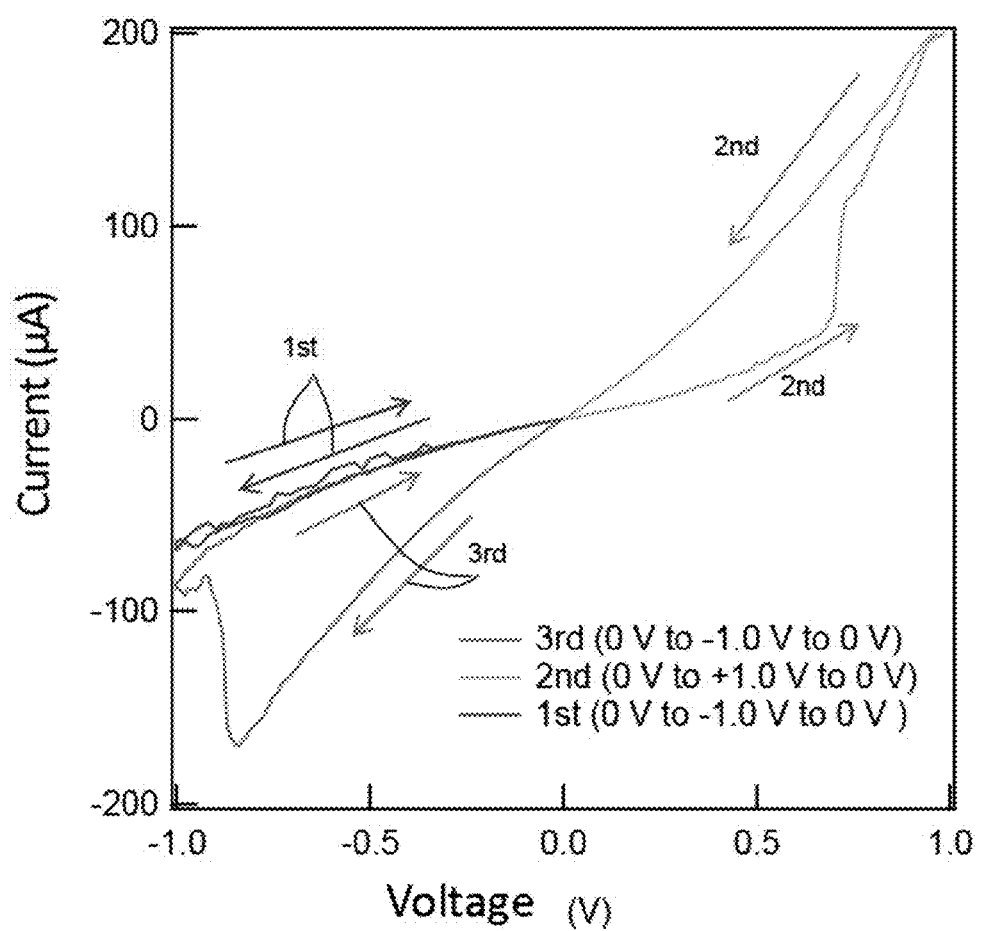
FIG. 5 is a chart showing a current-voltage characteristics obtained in the first measurement of the sample fabricated in Example 1.

FIG. 5 shows the current-voltage characteristics obtained in the first measurement of the sample fabricated in Example 1. The horizontal axis represents voltage (V), and the vertical axis represents current I ($\mu$A). As the first measurement of current-voltage characteristics, applied voltage was changed from 0 V to −1 V and returned to 0 V. Then the voltage was changed from 0 V to 1 V and returned to 0V. Furthermore the applied voltage was changed from 0 V to −1 V and returned to 0V. The figure shows that the current-voltage characteristics exhibit hysteresis: if the voltage between the one electrode 5A and the other electrode 5B is continuously changed from a negative value to a positive value, the waveform of the current fed between the one electrode 5A and the other electrode 5B becomes asymmetric. In other words, a current waveform containing asymmetric hysteresis depending on voltage sweeping direction was found to be contained. The arrow in the figure shows the voltage sweeping direction. The measurement was performed at room temperature.

Figure 6:
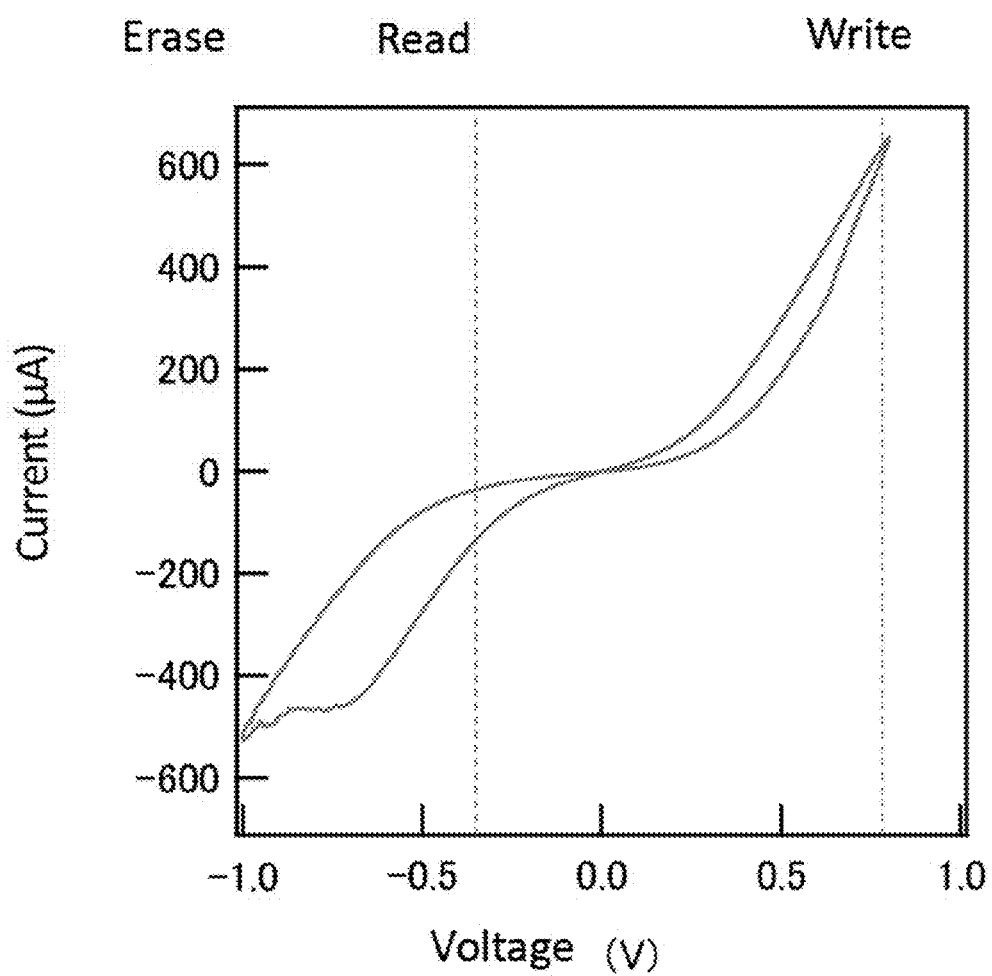
FIG. 6 is a chart showing a current-voltage characteristics obtained in the second and subsequent measurements of the sample fabricated in Example 1.

FIG. 6 shows the current-voltage characteristics obtained in the second and subsequent measurements of the sample fabricated in Example 1. The measurements were performed at room temperature. The figure shows that current characteristics vary between positive and negative voltages, and that in a state where negative bias was applied, negative differential conductance range existed. It was also found that the read voltage should be set at approximately −0.4 V, erase voltage should be set at approximately −1.0 V, and write voltage should be set at approximately 0.75 V.

Figure 7:
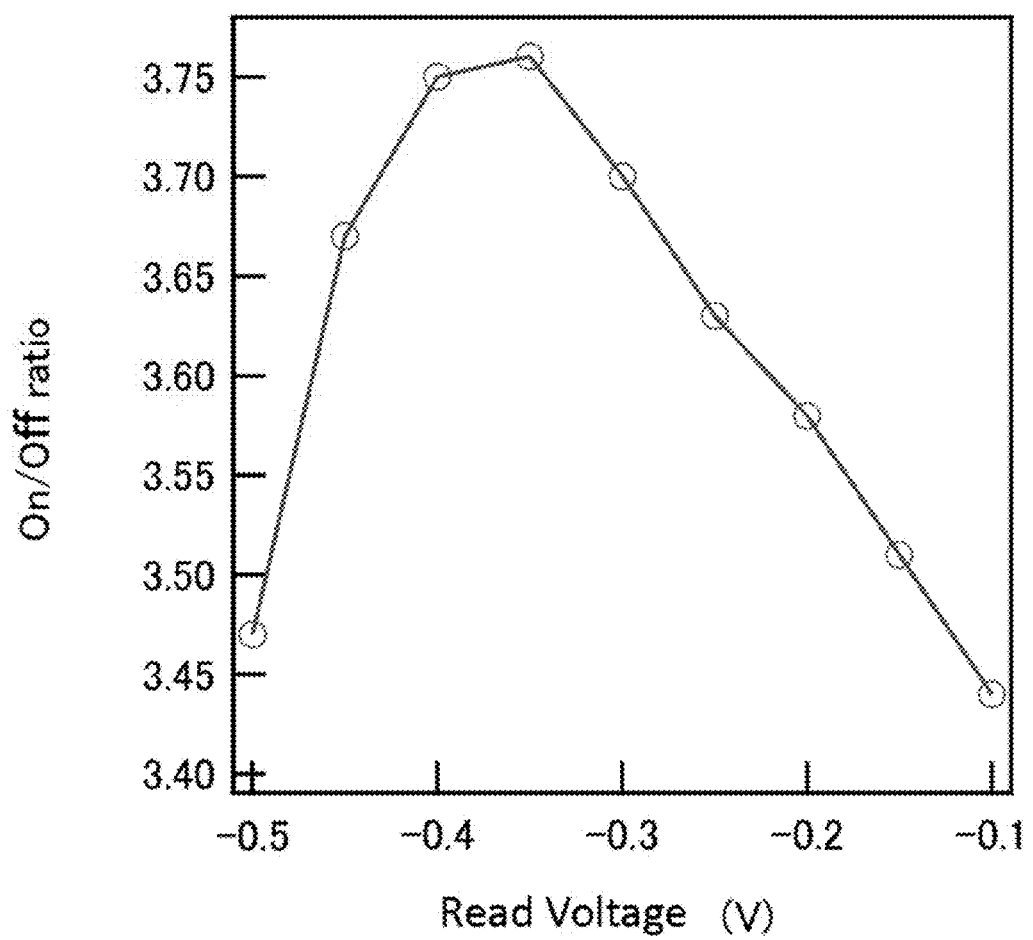
FIG. 7 is a chart showing the dependency of On/Off ratio on read voltage, which is the ratio of the current value in On state where read voltage is applied after the application of write voltage to the current value in Off state where read voltage is applied after the application of erase voltage, in the sample fabricated in Example 1.

FIG. 7 is a chart showing the dependency of On/Off ratio on read voltage, which is the ratio of the current value in On state where read voltage is applied after the application of write voltage to the current value in Off state where read voltage is applied after the application of erase voltage, in the sample fabricated in Example 1. The horizontal axis represents voltage (V), and the vertical axis represents On/Off ratio. The measurements were performed at room temperature. The On/Off ratio was found to be the highest when the read voltage was set at −0.35 V.

Figure 8:
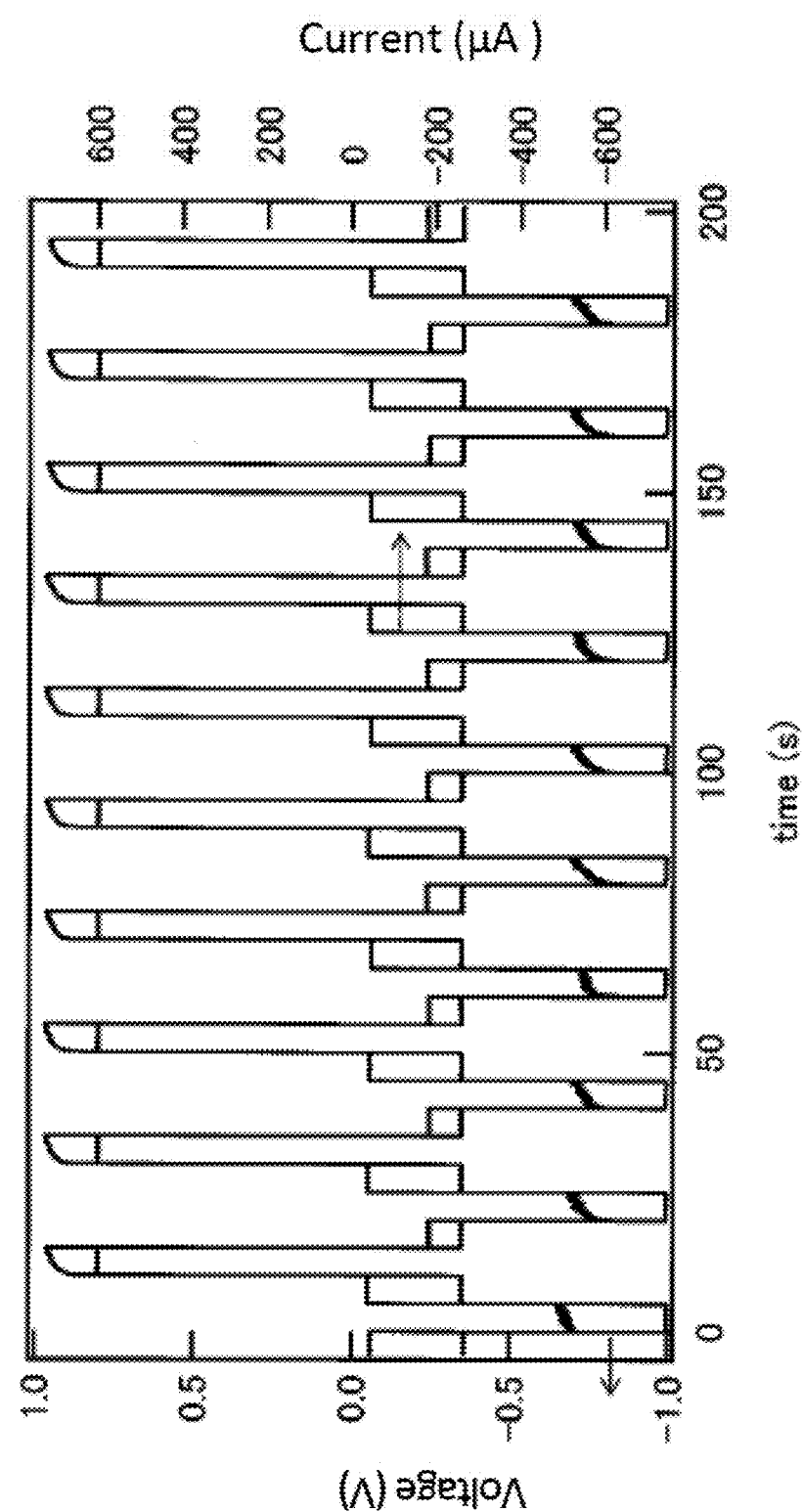
FIG. 8 is a chart showing current characteristics obtained when pulse train per 5 second of write voltage, read voltage, erase voltage, and read voltage (20 second cycle, correspondence to 50 mHz frequency) was applied to the sample fabricated in Example 1.

FIG. 8 is a chart showing a current characteristics obtained when pulse train per 5 second of write voltage $V_{write}$=0.8 V, read voltage $V_{read}$=−0.35 V, erase voltage $V_{erase}$=−1.0 V, and read voltage $V_{read}$=−0.35 V (20 second cycle, correspondence to 50 mHz frequency) was applied to the sample fabricated in Example 1. The horizontal axis represents time (s), left vertical axis represents voltage (V), and right vertical axis represents current (μA). The measurements were conducted at room temperature. The current waveform corresponded to the change in pulse voltage: a difference was found between the current value obtained when read voltage was applied after the application of write voltage (On state) and the current value obtained when read voltage was applied after the application of erase voltage (Off state), which means that memory operation was being performed. The On/Off ratio at this time was 178.6 μA/47.4 μA=3.76.

Figure 9:
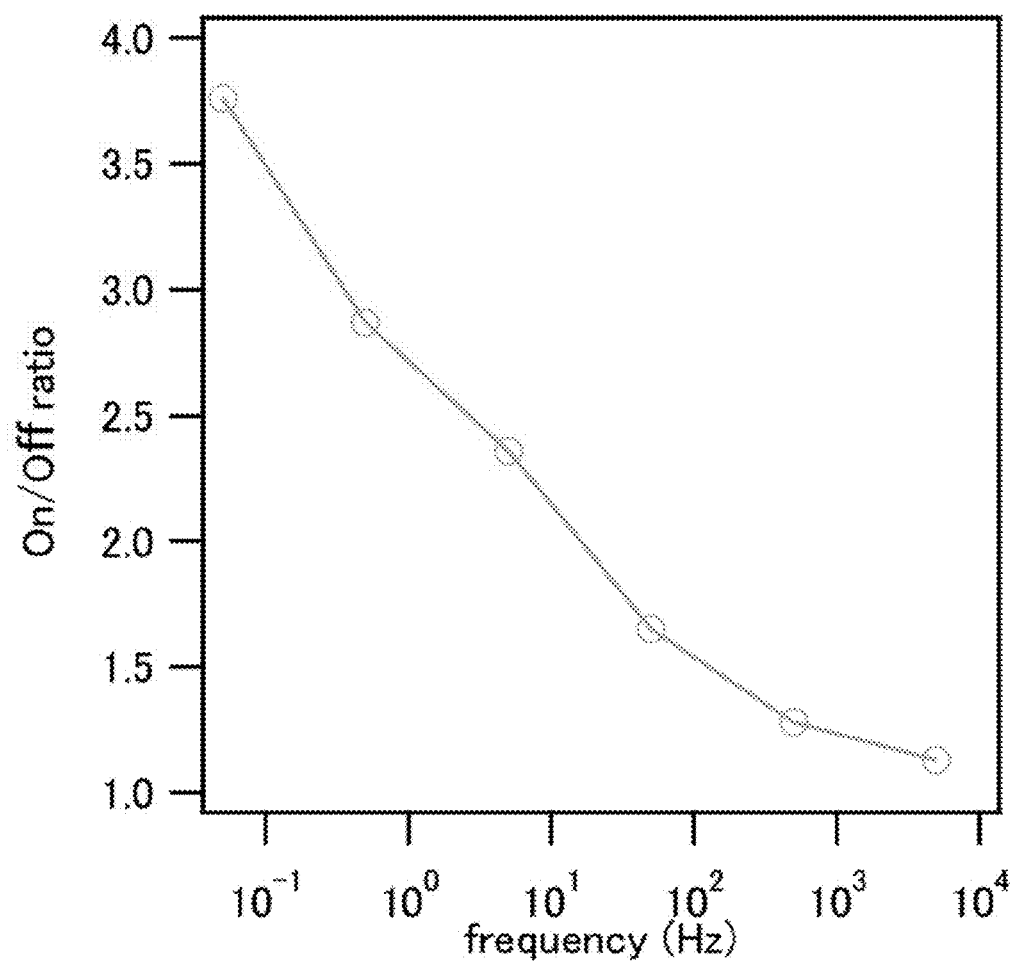
FIG. 9 is a chart showing the result of evaluation in the sample fabricated in Example 1, and showing the dependency of On/Off ratio on frequency, which is the ratio of the current value in On state, namely when read voltage was applied after the application of write voltage, to the current value in Off state, namely when read voltage was applied after the application of erase voltage, when the time necessary for the pulse train of a set of write voltage, read voltage, erase voltage, and read voltage is defined as one cycle and its inverse is defined as frequency.

FIG. 9 shows the result of evaluation in the sample fabricated in Example 1, and showing the dependency of On/Off ratio on frequency, which is the ratio of the current value in On state, namely when read voltage was applied after the application of write voltage, to the current value in Off state, namely when read voltage was applied after the application of erase voltage, when the time necessary for the pulse train of a set of write voltage, read voltage, erase voltage, and read voltage is defined as one cycle and its inverse is defined as frequency. The horizontal axis represents frequency (Hz) and the vertical axis represents On/Off ratio. The measurements were performed at room temperature. When the pulse train frequency was increased from 50 mHz to 500 mHz, 5 Hz, 50 Hz, 500 Hz, and then to 5 kHz, the On/Off ratio was found to decrease as follows: 3.76 (=178.6 μA/47.4 μA), 2.87 (=145.8 μA/50.8 μA), 2.36 (=114.8 μA/48.6 μA), 1.65 (=85.6 μA/51.9 μA), 1.28 (=70.4 μA/54.9 μA), and 1.13 (=62.6 μA/55.5 μA). The current followed the change in voltage at any frequencies.

Next, a result is described below, which is obtained by measuring the sample fabricated in Example 1 in a vacuum at −40° C.

Figure 10:
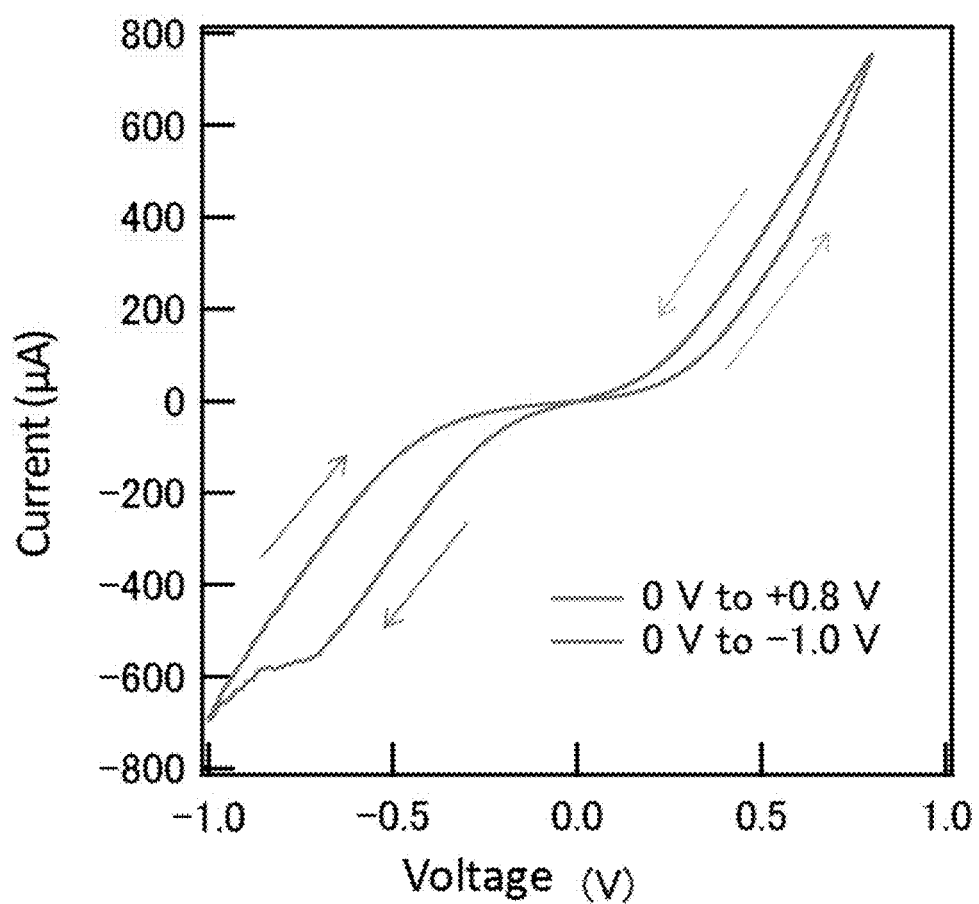
FIG. 10 is a chart showing the result of evaluation in the sample fabricated in Example 1, and showing a current-voltage characteristics which is obtained by measuring in a vacuum at −40° C.

FIG. 10 is a chart showing a current-voltage characteristics. The horizontal axis represents voltage (V) and the vertical axis represent current (μA). As in the case of FIG. 6, the current characteristics differ between positive and negative voltages, and it was found that there existed a negative differential conductance region in a state where negative bias was applied. It was also found that read voltage should be set at approximately −0.3 V, erase voltage should be set at approximately −1.0 V, and write voltage should be set at approximately 0.8 V.

Figure 11:
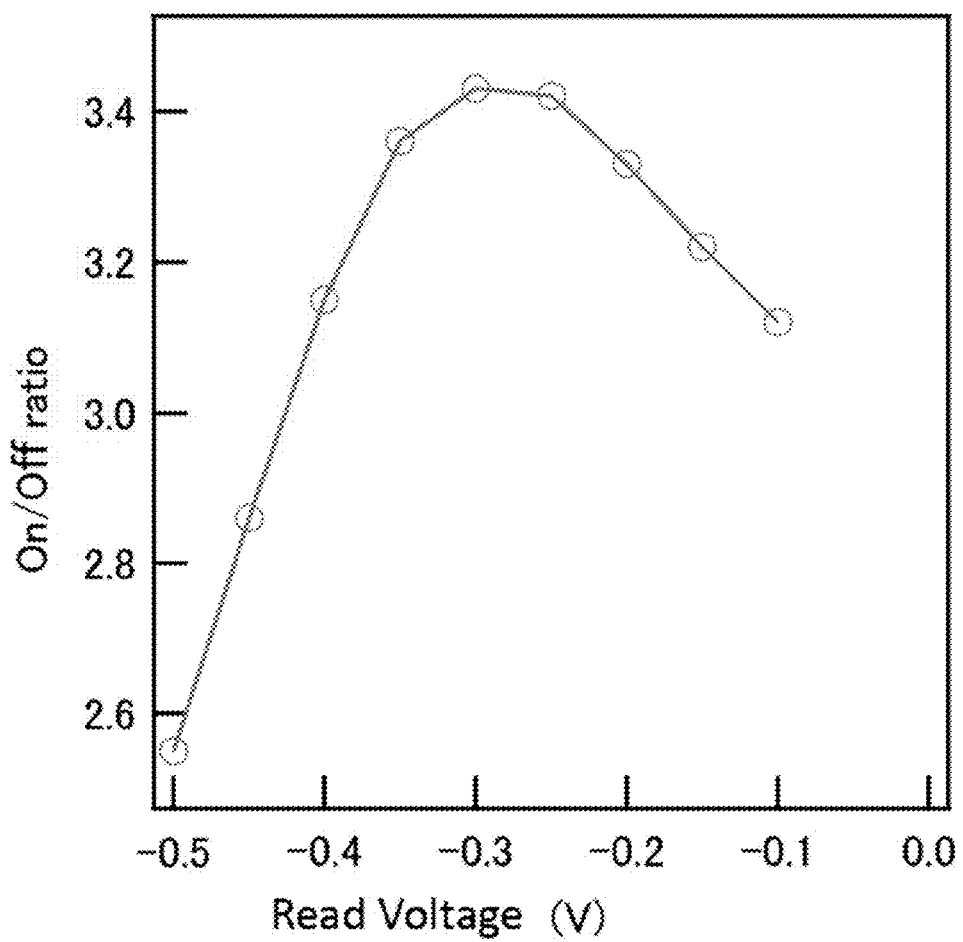
FIG. 11 is a chart showing the result of evaluation in the sample fabricated in Example 1, and showing the dependency of On/Off ratio, which is the ratio of the current value in On state where read voltage is applied after the application of write voltage to the current value in Off state where read voltage is applied after the application of erase voltage, on read voltage in a vacuum at −40° C.

FIG. 11 is a chart showing the dependency of On/Off ratio, which is the ratio of the current value in On state where read voltage is applied after the application of write voltage to the current value in Off state where read voltage is applied after the application of erase voltage, on read voltage. The horizontal axis represents voltage (V), and the vertical axis represents On/Off ratio. The On/Off ratio was found to be the highest when the read voltage was set at −0.3 V.

Figure 12:
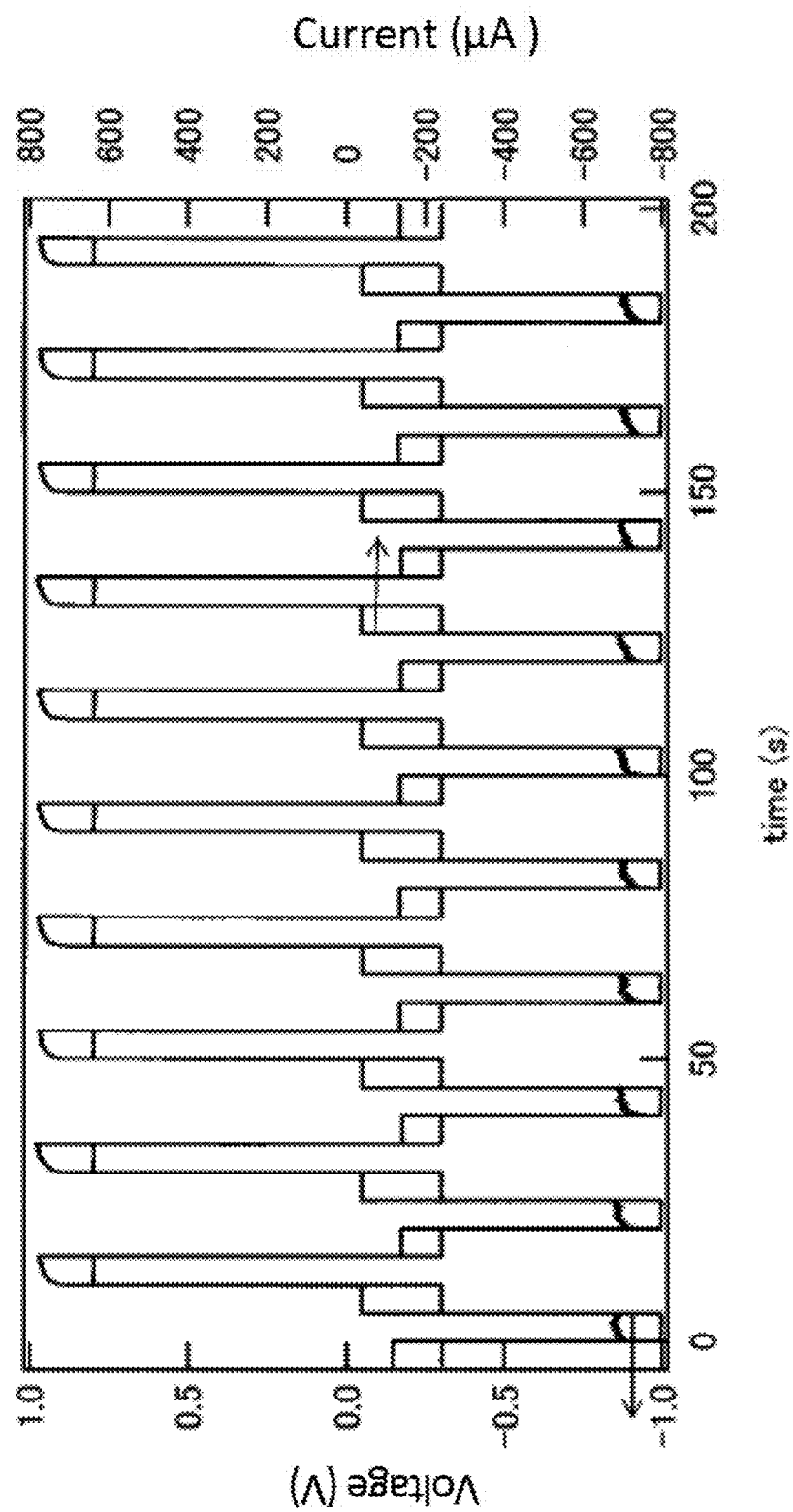
FIG. 12 is a chart showing the result of evaluation in the sample fabricated in Example 1, and showing the current characteristics obtained when pulse train per 5 second of write voltage, read voltage, erase voltage, and read voltage (20 second cycle, correspondence to 50 mHz frequency) was applied in a vacuum at −40° C.

FIG. 12 is a chart showing the current characteristics obtained when pulse train per 5 second of write voltage $V_{write}$=0.8 V, read voltage $V_{read}$=−0.35 V, erase voltage $V_{erase}$=−1.0 V, and read voltage $V_{read}$=−0.35 V was applied. The horizontal axis represents time (s), left vertical axis represents voltage (V), and right vertical axis represents current (μA). In this case, the On/Off ratio at this time was 143.0 μA/39.5 μA=3.62.

Figure 13:
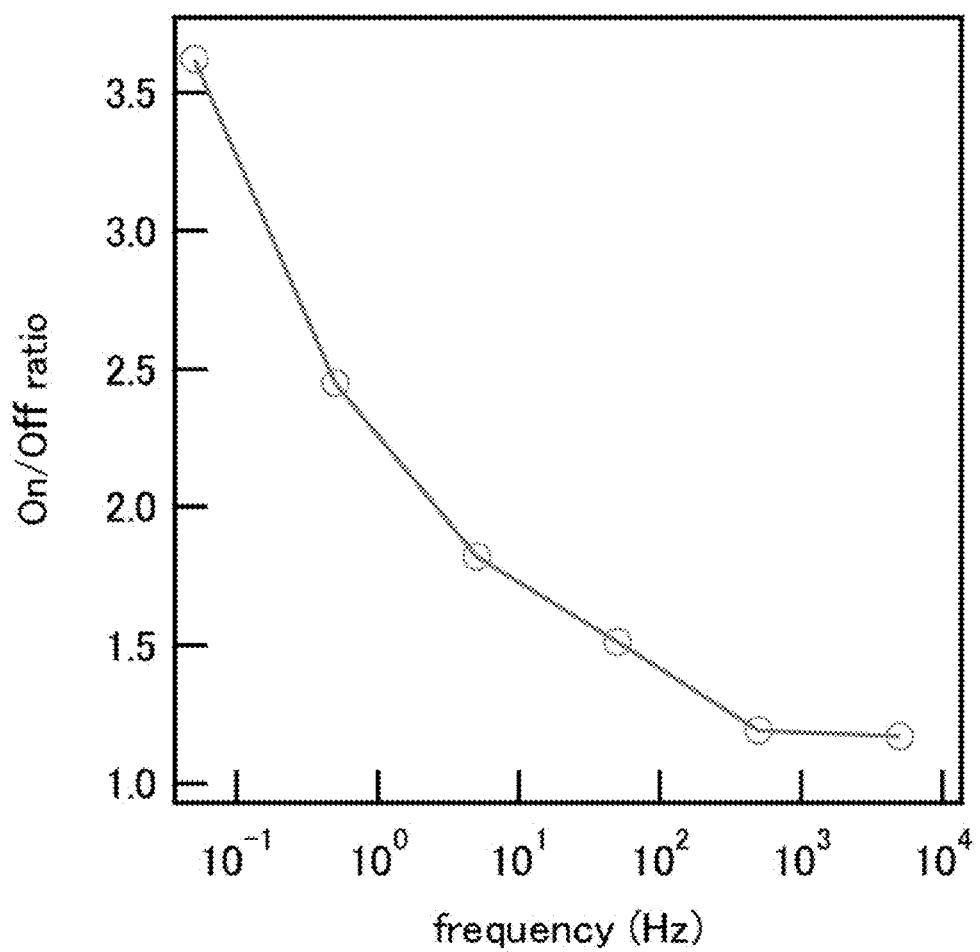
FIG. 13 is a chart showing the result of evaluation in the sample fabricated in Example 1, and showing the dependency of On/Off ratio, which is the ratio of the current value in On state where read voltage is applied after the application of write voltage to the current value in Off state where read voltage is applied after the application of erase voltage, on frequency in a vacuum at −40° C.

FIG. 13 shows the dependency of On/Off ratio on frequency, which is the ratio of the current value in On state where read voltage is applied after the application of write voltage to the current value in Off state where read voltage is applied after the application of erase voltage. The horizontal axis represents frequency (Hz) and the vertical axis represents On/Off ratio. When the pulse train frequency was increased from 50 mHz to 500 mHz, 5 Hz, 50 Hz, 500 Hz, and then to 5 kHz, the On/Off ratio was found to decrease as follows: 3.62 (=143.0 μA/39.5 μA), 2.45 (=105.0 μA/62.1 μA), 1.82 (=80.4 μA/44.1 μA), 1.51 (=71.6 μA/47.4 μA), 1.19 (=59.8 μA/50.2 μA), and 1.17 (=56.4 μA/48.0 μA). The current followed the change in voltage at any frequencies.

Next, a result is described below, which is obtained by measuring the sample fabricated in Example 1 in a vacuum at 120° C.

Figure 14:
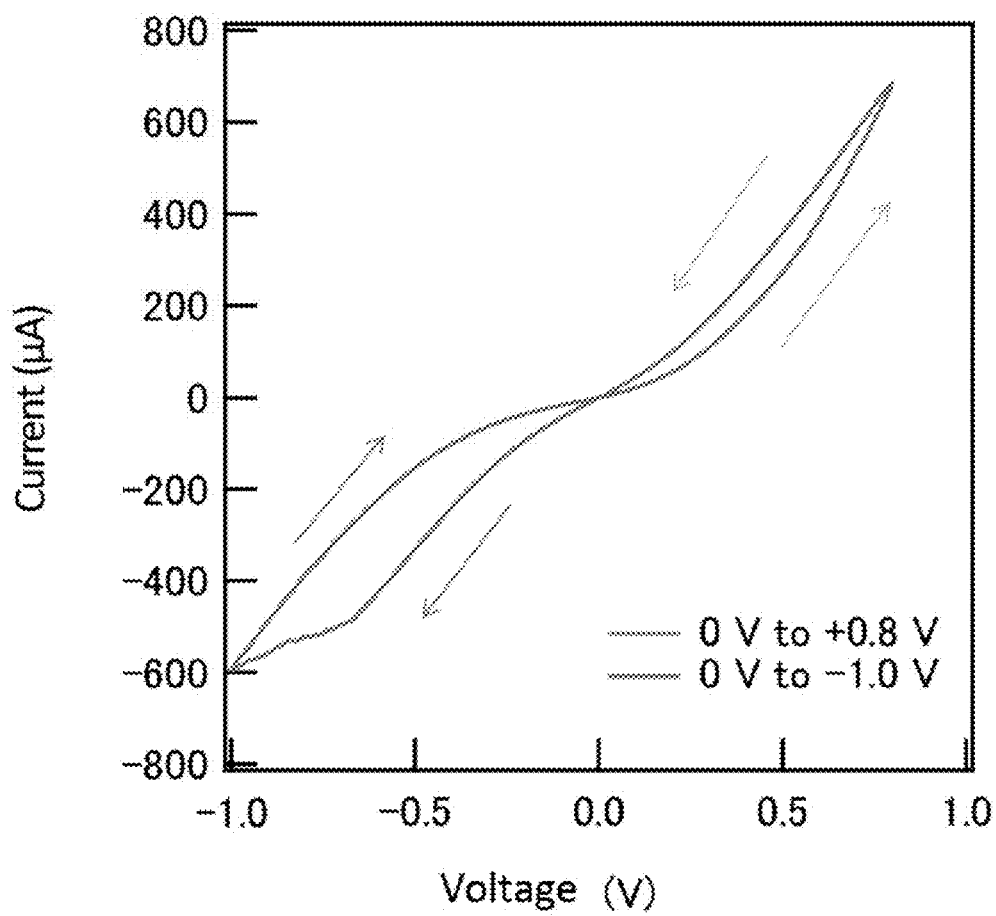
FIG. 14 is a chart showing the result of evaluation in the sample fabricated in Example 1, and showing a current-voltage characteristics in a vacuum at 120° C.

FIG. 14 is a chart showing a current-voltage characteristics. The horizontal axis represents voltage (V) and the vertical axis represent current (μA). As in the case of FIG. 6, the current characteristics differ between positive and negative voltages, and it was found that there existed a negative differential conductance region in a state where negative bias was applied. It was also found that read voltage should be set at approximately −0.2 V, erase voltage should be set at approximately −1.0 V, and write voltage should be set at approximately 0.8 V.

Figure 15:
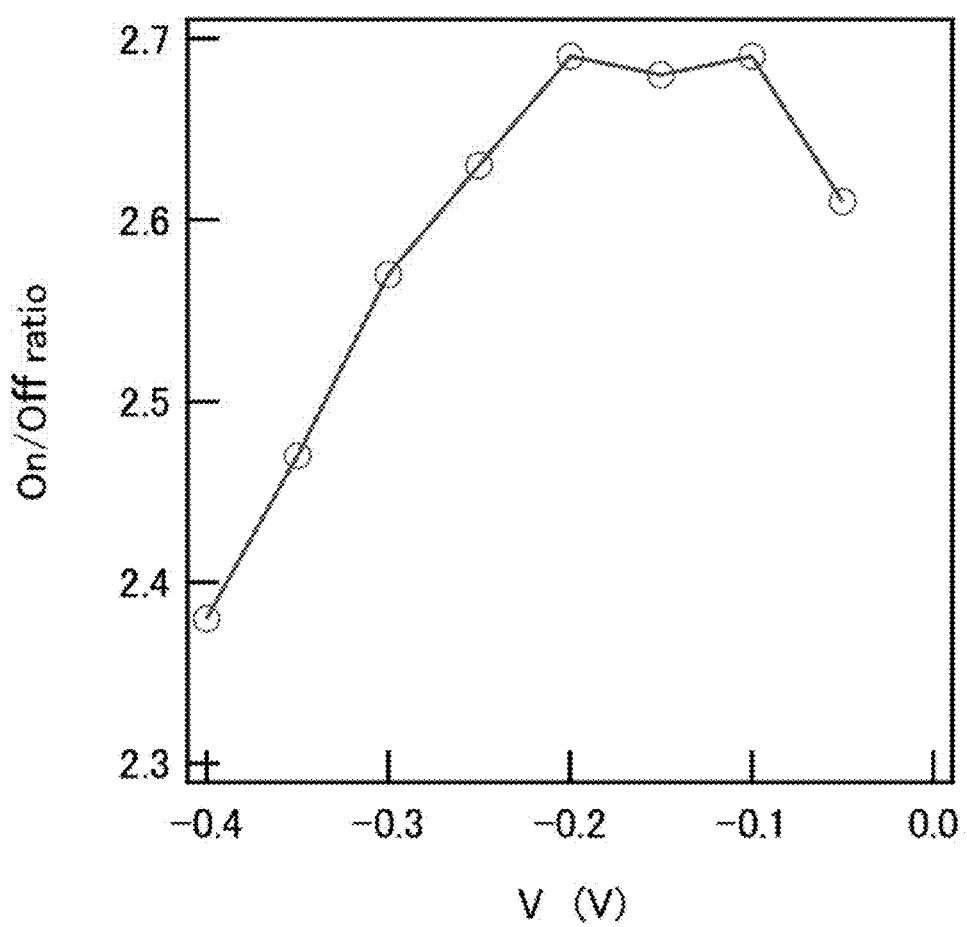
FIG. 15 is a chart showing the result of evaluation in the sample fabricated in Example 1, and showing the dependency of On/Off ratio, which is the ratio of the current value in On state where read voltage is applied after the application of write voltage to the current value in Off state where read voltage is applied after the application of erase voltage, on read voltage in a vacuum at 120° C.

FIG. 15 is a chart showing the dependency of On/Off ratio, which is the ratio of the current value in On state where read voltage is applied after the application of write voltage to the current value in Off state where read voltage is applied after the application of erase voltage, on read voltage. The horizontal axis represents voltage (V), and the vertical axis represents On/Off ratio. The On/Off ratio was found to be the highest when the read voltage was set at −0.2 V.

Figure 16:
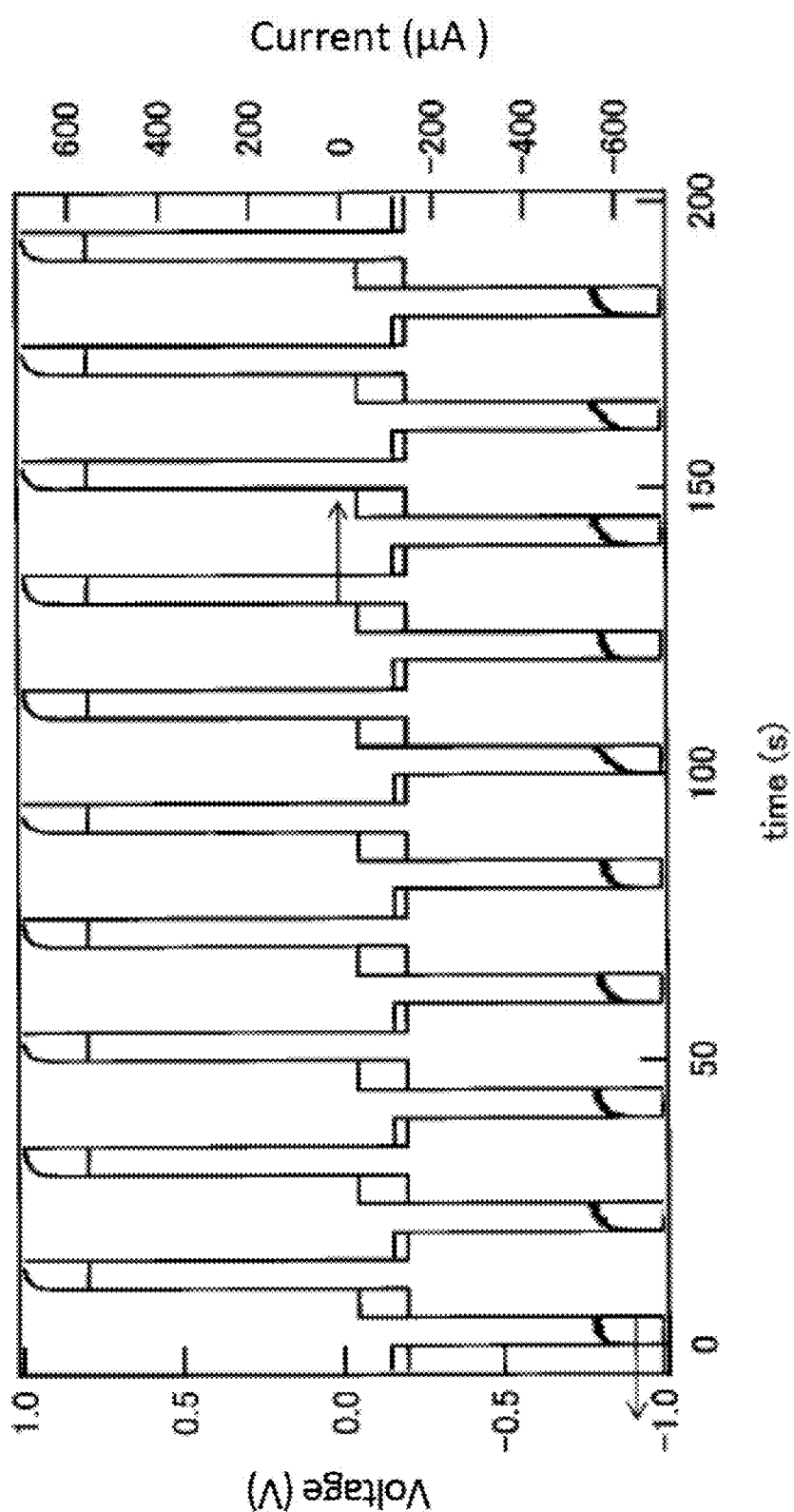
FIG. 16 is a chart showing the result of evaluation in the sample fabricated in Example 1, and showing a current characteristics obtained when pulse train per 5 second of write voltage, read voltage, erase voltage, and read voltage (20 second cycle, correspondence to 50 mHz frequency) was applied in a vacuum at 120° C.

FIG. 16 is a chart showing the current characteristics obtained when pulse train per 5 second of write voltage $V_{write}=0.8$ V, read voltage $V_{read}=-0.2$ V, erase voltage $V_{erase}=-1.0$ V, and read voltage $V_{read}=-0.2$ V was applied. The horizontal axis represents time (s), left vertical axis represents voltage (V), and right vertical axis represents current (μA). In this case, the On/Off ratio at this time was 112.9 μA/33.7 μA=3.55.

Figure 17:
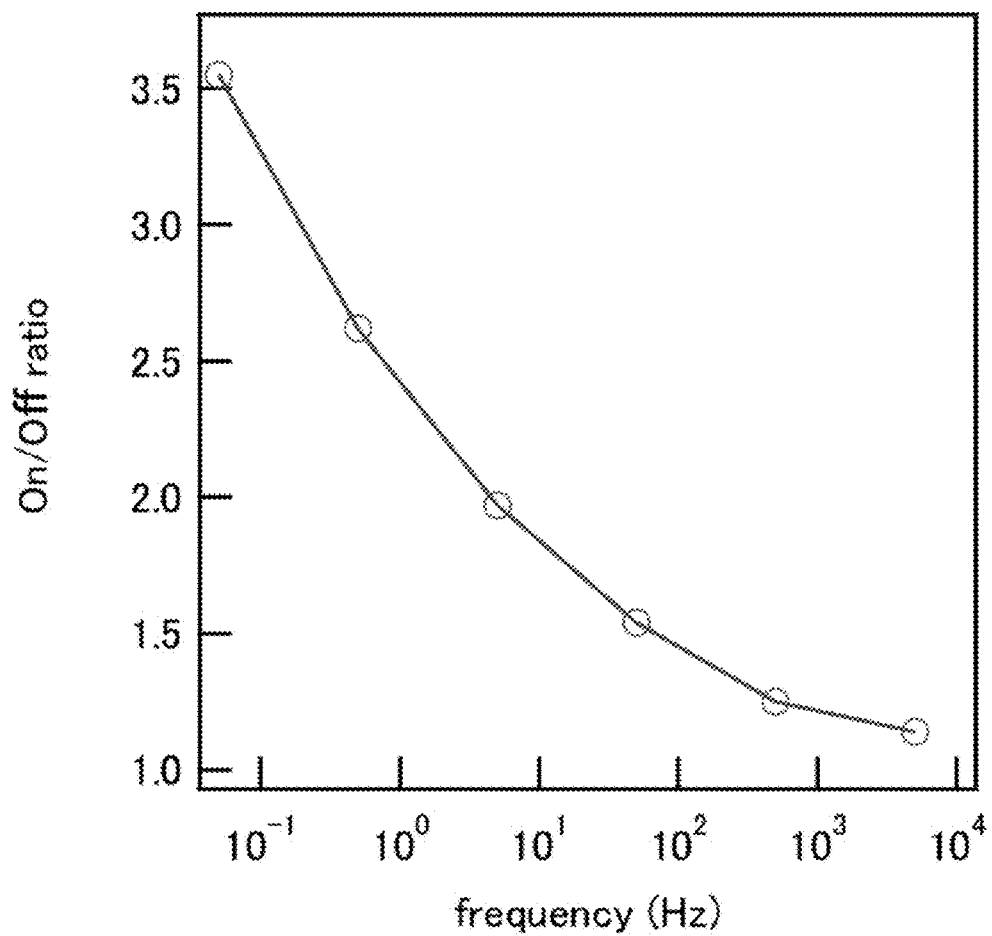
FIG. 17 is a chart showing the result of evaluation in the sample fabricated in Example 1, and showing the dependency of On/Off ratio on frequency in a vacuum at 120° C., which is the ratio of the current value in On state, namely when read voltage was applied after the application of write voltage, to the current value in Off state, namely when read voltage was applied after the application of erase voltage, when the time necessary for the pulse train of a set of write voltage, read voltage, erase voltage, and read voltage is defined as one cycle and its inverse is defined as frequency.

FIG. 17 is a chart showing the dependency of On/Off ratio on frequency, which is the ratio of the current value in On state, namely when read voltage was applied after the application of write voltage, to the current value in Off state, namely when read voltage was applied after the application of erase voltage, when the time necessary for the pulse train of a set of write voltage, read voltage, erase voltage, and read voltage is defined as one cycle and its inverse is defined as frequency. The horizontal axis represents frequency (Hz) and the vertical axis represents On/Off ratio. When the pulse train frequency was increased from 50 mHz to 500 mHz, 5 Hz, 50 Hz, 500 Hz, and then to 5 kHz, the On/Off ratio was found to decrease as follows: 3.55 (=112.9 μA/33.7 μA), 2.62 (=100.3 μA/38.3 μA), 1.97 (=78.5 μA/39.9 μA), 1.54 (=62.4 μA/40.6 μA), 1.25 (=50.4 μA/40.5 μA), and 1.14 (=46.4 μA/40.8 μA). The current followed the change in voltage at any frequencies.

Next, a result is described below, which is obtained by measuring in the air at 120° C.

Figure 18:
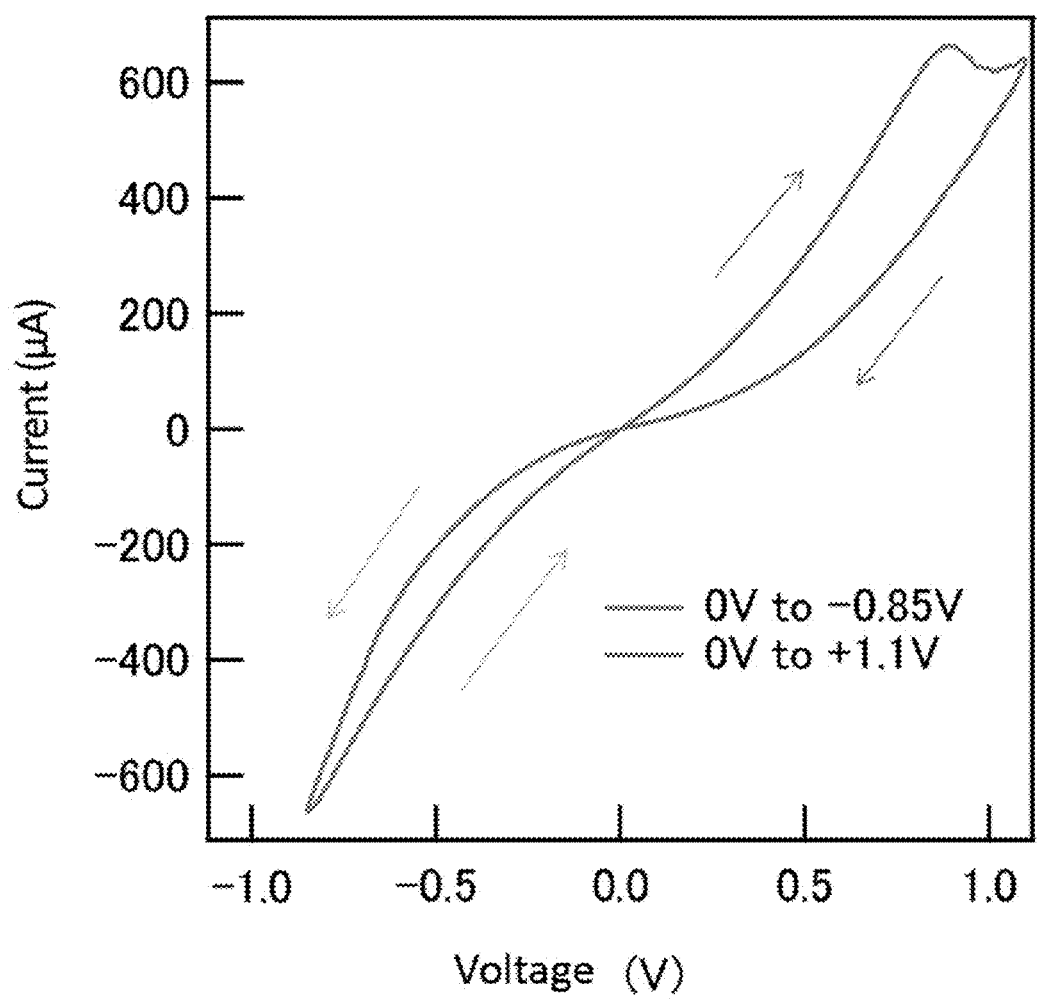
FIG. 18 is a chart showing a current-voltage characteristics in the air at 120° C.

FIG. 18 is a chart showing a current-voltage characteristics. The horizontal axis represents voltage (V) and the vertical axis represent current (μA). As in the case of FIG. 6, the current characteristics differ between positive and negative voltages, and it was found that there existed a negative differential conductance region in a state where positive bias was applied. It was found that read voltage should be set at approximately +0.1 V, erase voltage should be set at approximately +1.1 V, and write voltage should be set at approximately −0.85 V.

Figure 19:
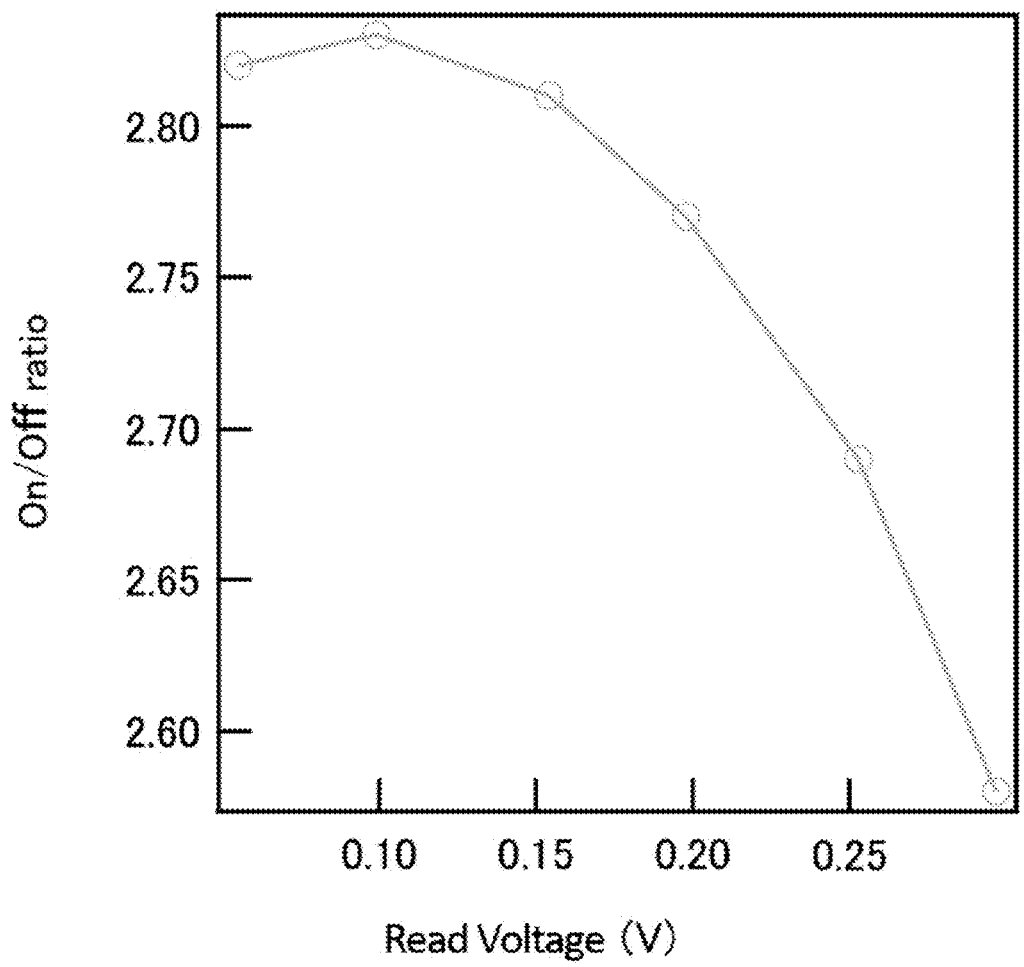
FIG. 19 is a chart showing the result of evaluation in the sample fabricated in Example 1, and showing the dependency of On/Off ratio, which is the ratio of the current value in On state where read voltage is applied after the application of write voltage to the current value in Off state where read voltage is applied after the application of erase voltage, on read voltage in the air at 120° C.

FIG. 19 is a chart showing the dependency of On/Off ratio, which is the ratio of the current value in On state where read voltage is applied after the application of write voltage to the current value in Off state where read voltage is applied after the application of erase voltage, on read voltage. The horizontal axis represents voltage (V), and the vertical axis represents On/Off ratio. The On/Off ratio was found to be the highest when the read voltage was set at +0.1 V.

Figure 20:
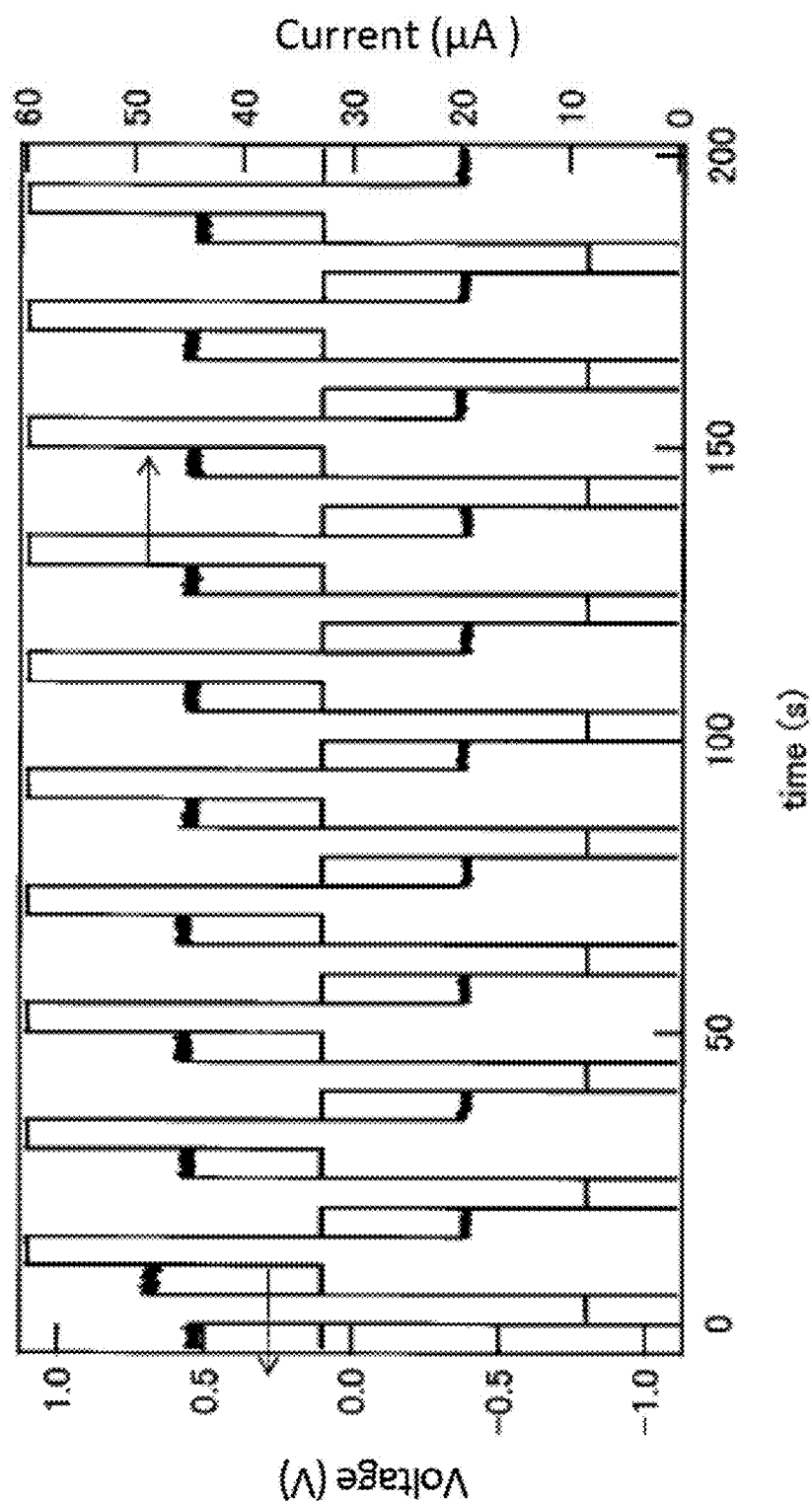
FIG. 20 is a chart showing the result of evaluation in the sample fabricated in Example 1, and showing a current characteristics obtained when pulse train per 5 second of write voltage, read voltage, erase voltage, and read voltage (20 second cycle, correspondence to 50 mHz frequency) was applied in the air at 120° C.

FIG. 20 is a chart showing the current characteristics obtained when pulse train per 5 second of write voltage $V_{write}=-0.85$ V, read voltage $V_{read}=+0.1$ V, erase voltage, $V_{erase}=+1.1$V and read voltage $V_{read}=+0.1$ V was applied. The horizontal axis represents time (s), left vertical axis represents voltage (V), and right vertical axis represents current (μA). In this case, the On/Off ratio at this time was 45.0 μA/19.9 μA=2.26.

Figure 21:
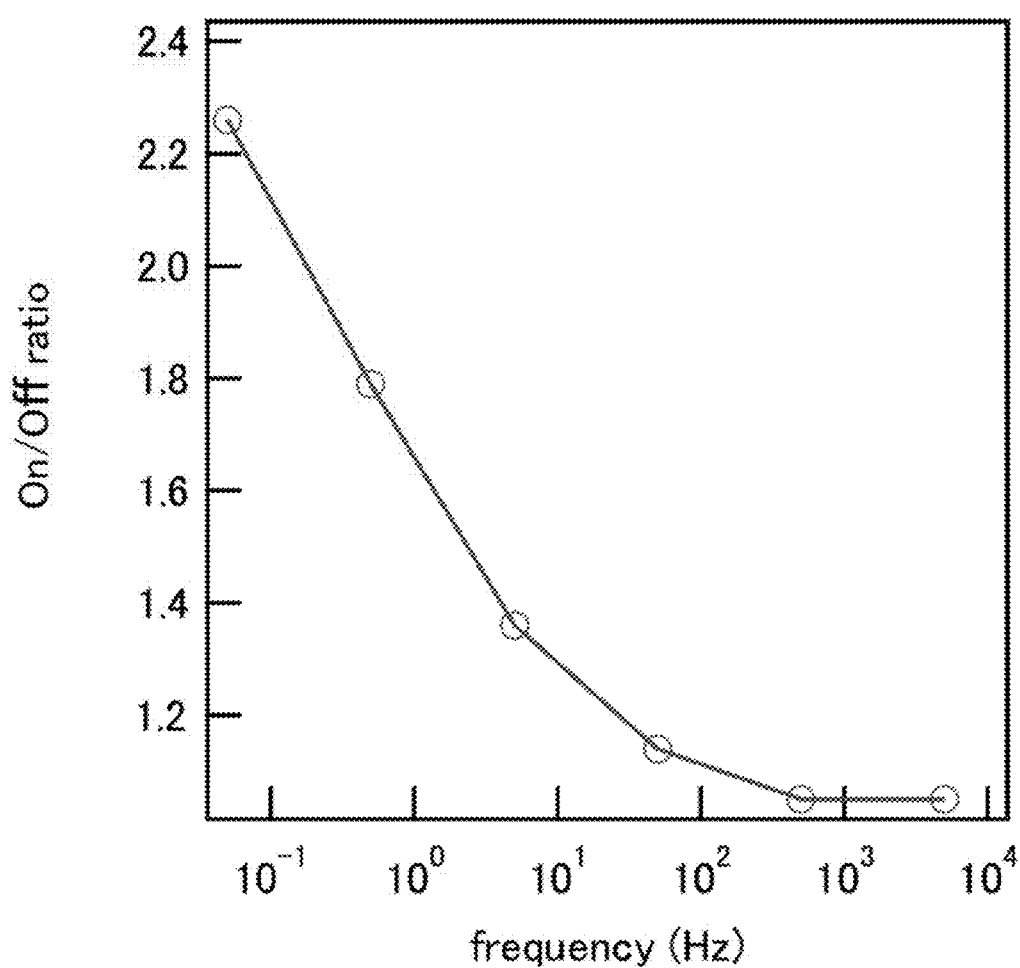
FIG. 21 is a chart showing the result of evaluation in the sample fabricated in Example 1, and showing the dependency of On/Off ratio on frequency in the air at 120° C., which is the ratio of the current value in On state, namely when read voltage was applied after the application of write voltage, to the current value in Off state, namely when read voltage was applied after the application of erase voltage, when the time necessary for the pulse train of a set of write voltage, read voltage, erase voltage, and read voltage is defined as one cycle and its inverse is defined as frequency.

FIG. 21 is a chart showing the dependency of On/Off ratio on frequency, which is the ratio of the current value in On state, namely when read voltage was applied after the application of write voltage, to the current value in Off state, namely when read voltage was applied after the application of erase voltage, when the time necessary for the pulse train of a set of write voltage, read voltage, erase voltage, and read voltage is defined as one cycle and its inverse is defined as frequency. The horizontal axis represents frequency (Hz) and the vertical axis represents On/Off ratio. When the pulse train frequency was increased from 50 mHz to 500 mHz, 5 Hz, 50 Hz, 500 Hz, and then to 5 kHz, the On/Off ratio was found to decrease as follows: 2.26 (=45.0 μA/19.9 μA), 1.79 (=35.8 μA/20.0 μA), 1.36 (=29.4 ρA/21.6 μA), 1.14 (=24.9 μA/21.8 μA), 1.05 (=22.3 μA/21.3 μA), and 1.05 (=22.1 μA/21.1 μA). The current followed the change in voltage at any frequencies.

It was thus found that the sample fabricated in Example 1 operated as a memory element independent of operating environment such as temperature and atmosphere.

Example 2

Figure 22:
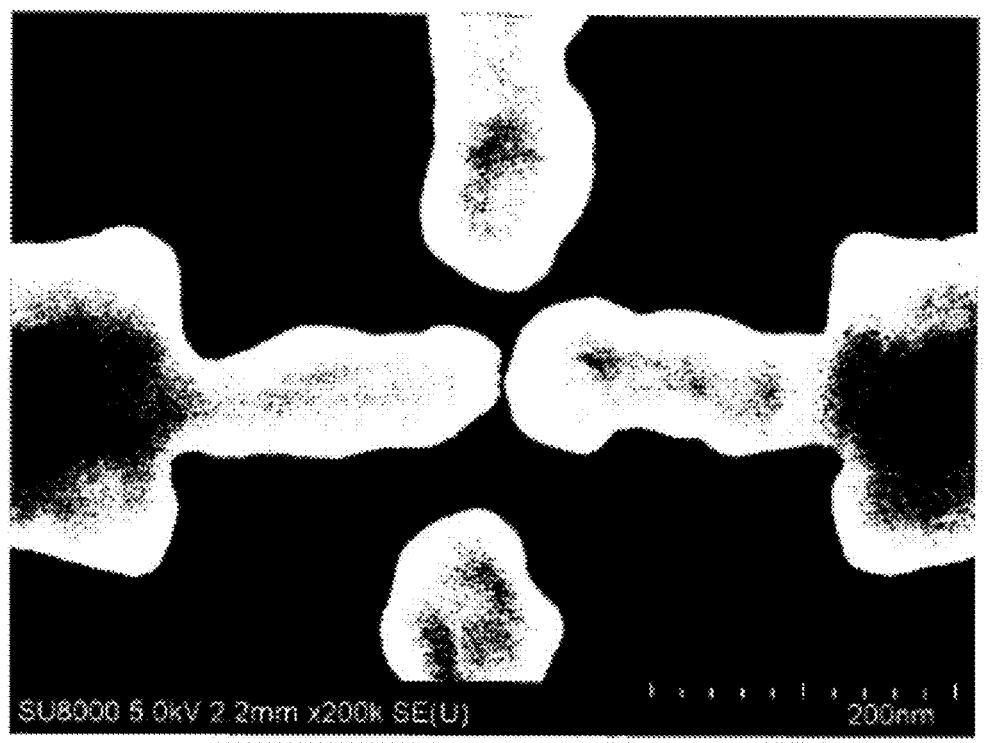
FIG. 22 is an SEM image of the sample fabricated in Example 2.

A sample used in Example 2 was fabricated by the same method as Example 1. FIG. 22 is an SEM image of the sample fabricated in Example 2. The nanogap between electrodes was 1.79 nm. In addition, side gates were fabricated at the same time in Example 2.

Figure 23:
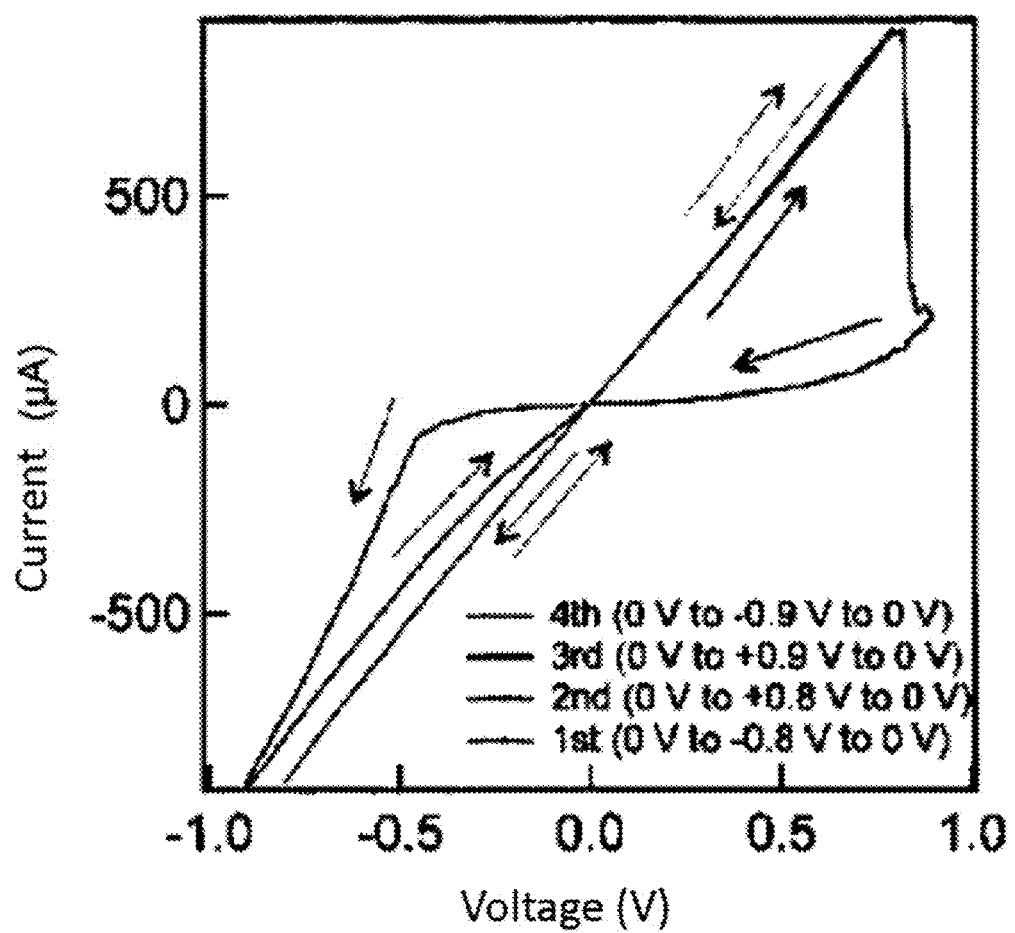
FIG. 23 is a chart showing a current-voltage characteristics obtained in a first measurement of the sample fabricated in Example 2.

FIG. 23 shows the current-voltage characteristics obtained in a first measurement of the sample fabricated in Example 2. The horizontal axis represents voltage (V) and the vertical axis represents current (μA). In the first measurement: the voltage was increased at room temperature from 0 V to negative bias side and then returned to 0 V, increased from 0 V to positive bias side and then returned to 0V, increased from 0 V to negative bias side and then returned to 0 V, and furthermore increased from 0 V to positive bias side and then returned to 0V. The figure shows that the current-voltage characteristics in the first and the second measurements do not exhibit hysteresis, but that those in the third and the fourth measurements exhibit hysteresis. Negative differential conductance was observed in the third sweep, and when the voltage was changed from a positive value to a negative value and then from the negative value to a positive value continuously, the current waveform was found to become asymmetric. FIG. 23 shows that hysteresis develops when voltage sweep is performed continuously. Continuous voltage sweep to develop hysteresis is called forming here. The arrow in the figure represents voltage sweeping direction. The measurements were performed at room temperature.

Figure 24:
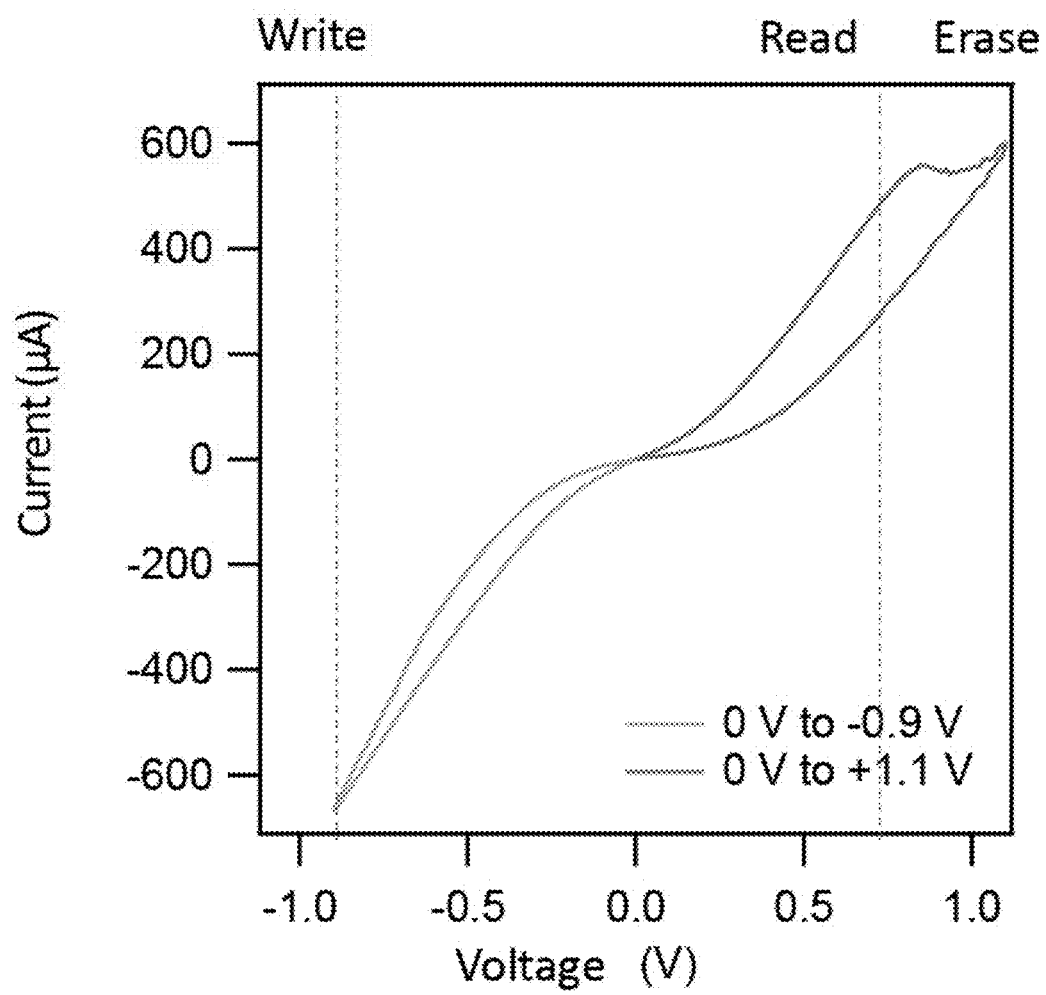
FIG. 24 is a chart showing a current-voltage characteristics obtained after forming.

FIG. 24 shows the current-voltage characteristics obtained after forming. The horizontal axis represents voltage (V), and the vertical axis represents current (μA). The measurements were performed at room temperature. As in the case of Example 1, the current-voltage characteristics exhibit hysteresis, and characteristics where negative differential conductance region exists was obtained.

Figure 25:
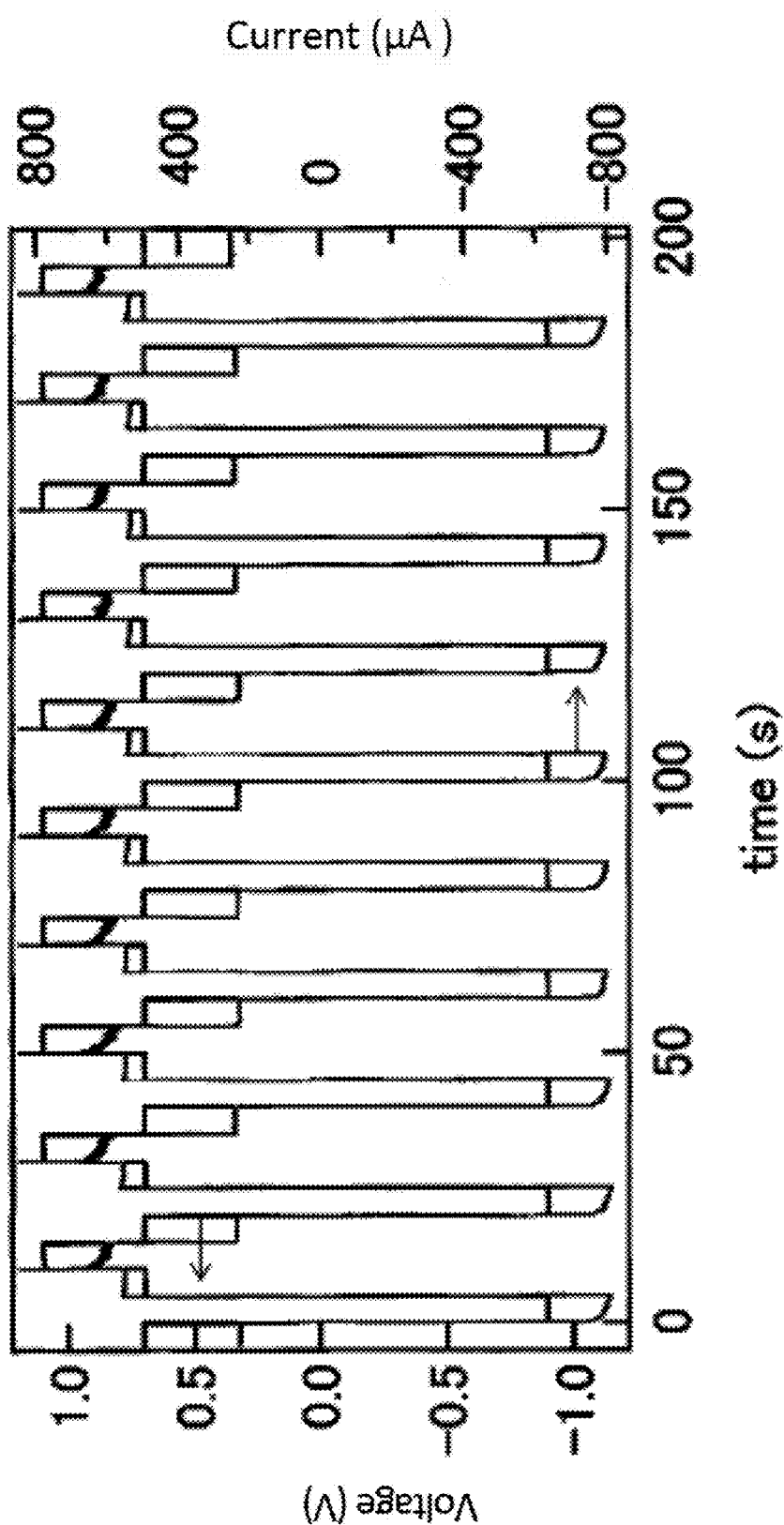
FIG. 25 is a chart showing a current characteristics obtained when pulse train per 5 second of write voltage, read voltage, erase voltage, and read voltage (20 second cycle, correspondence to 50 mHz frequency) was applied in the sample fabricated in Example 2.

FIG. 25 is a chart showing the current characteristics obtained when pulse train per 5 second of write voltage $V_{write}=-0.9$ V, read voltage $V_{read}=+0.7$ V, erase voltage $V_{erase}=+1.1$ V, and read voltage $V_{read}=+0.7$ V (20 sec. cycle, correspondence to 50 mHz frequency) was applied to the sample fabricated in Example 2. The horizontal axis represents time (s), left vertical axis represents voltage (V), and right vertical axis represents current (μA). The current is corresponded to the pulse train as FIG. 8. The On/Off ratio was 548.6 ρA/231.1 μA=2.26 at the read voltage 0.7V.

To exhibit that the halide ion affects elemental operation with this memory element, the samples fabricated in Examples 1 and 2 were dipped in a hexamethonium bromide (HMB) solution containing bromine ions, and the change in electrical characteristics between before and after the immersion was examined.

Figure 26:
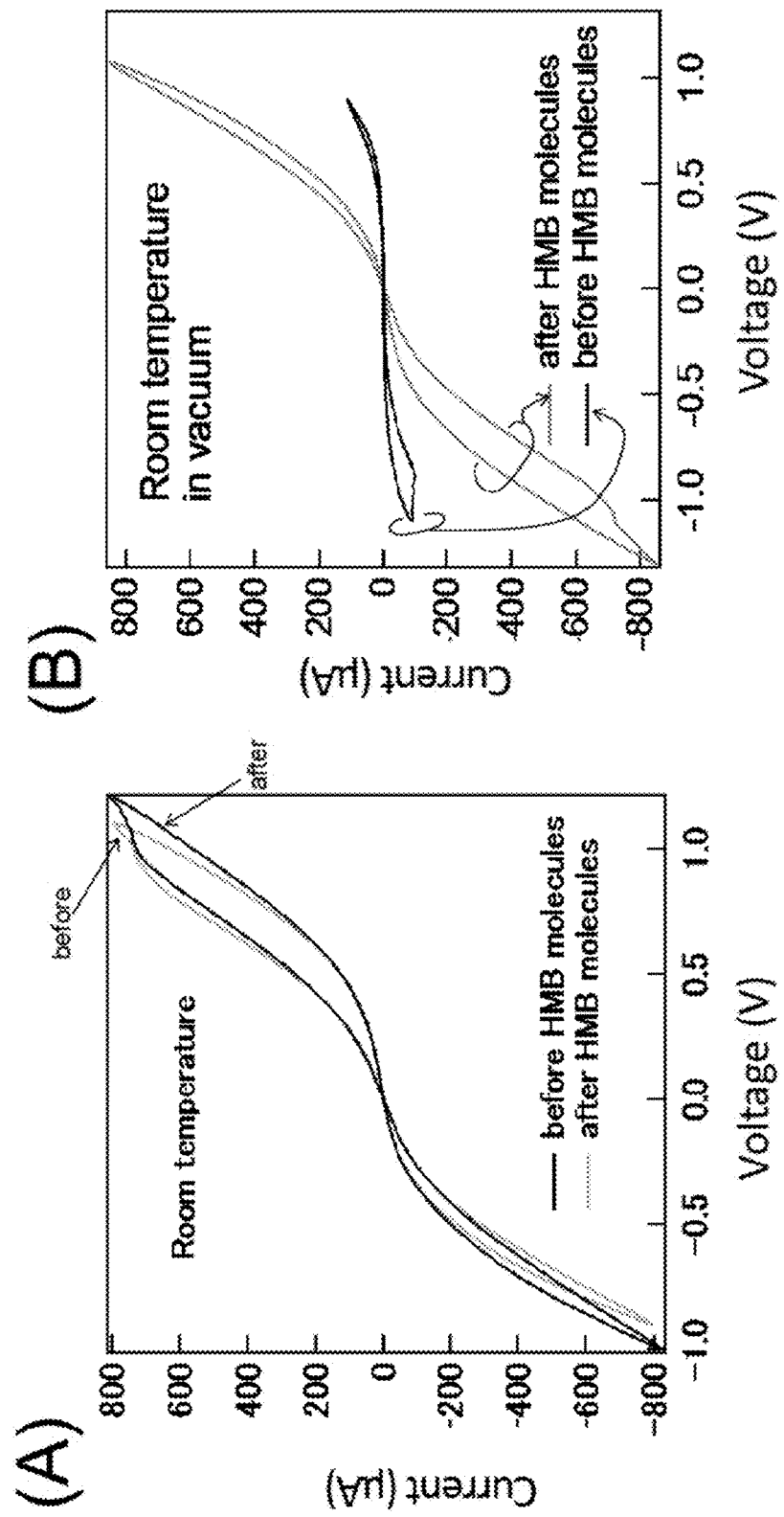
FIG. 26 (A) is a chart showing the current-voltage characteristics obtained before and after the sample fabricated in Example 1 was dipped in the HMB solution, and (B) is a chart showing the current-voltage characteristics obtained before and after the sample fabricated in Example 2 was dipped in the HMB solution.

FIG. 26 (A) shows the current-voltage characteristics obtained before and after the sample fabricated in Example 1 was dipped in the HMB solution, and (B) shows the current-voltage characteristics obtained before and after the sample fabricated in Example 2 was dipped in the HMB solution. Both samples in Examples 1 and 2 were measured at room temperature and in a vacuum. The vertical axis represents current (µA) and the horizontal axis represents voltage.

The results in both measurements show that the immersion in the HMB solution caused change in current-voltage characteristics to occur, and that the amount of current was larger after the immersion in the HMB solution. In particular, FIG. 26 (B) exhibits an increase in the amount of current by approximately 8 times. In addition, the On/Off ratio rarely changed before and after the immersion. Specifically, the On/Off ratio of the sample in Example 1 at read voltage of +0.1 V was 2.46 (=28.1 µA/111.4 µA) before the immersion, and its On/Off ratio after the immersion was 2.52 (=27.4 µA/10.9 µA). The On/Off ratio of the sample in Example 2 at voltage of −0.1 V was 2.74 (=1.5 µA/0.55 µA) before the immersion, and its On/Off ratio after the immersion was 2.45 (=26.1 µA/10.6 µA). It is assumed that the immersion of the nanogap electrodes in the HMB solution caused the number of bromide ions introduced between nanogap electrodes to become larger after the immersion than before the immersion. Consequently the increase in bromide ions existing in the nanogap is considered to affect the operation of the element as a change in current-voltage characteristics.

Comparative Example

In a gap between nanogap electrodes fabricated as in the case of Example 1, a metal nanoparticle protected by thiol-functionalized oligo (phenylene ethynylene) (OPE) was arranged. Specifically, 3.6 nm nanogap electrodes were fabricated using Au by electron beam lithography and molecular ruler electroless plating. The Au nanogap electrodes were then dipped in a solution of Au nanoparticles (average core diameter size of 2.0 nm) protected by thiol functional group. Electrical measurements were performed at room temperature.

[Chemical formula 1]

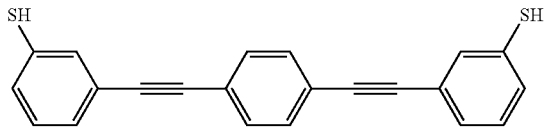

Figure 27:
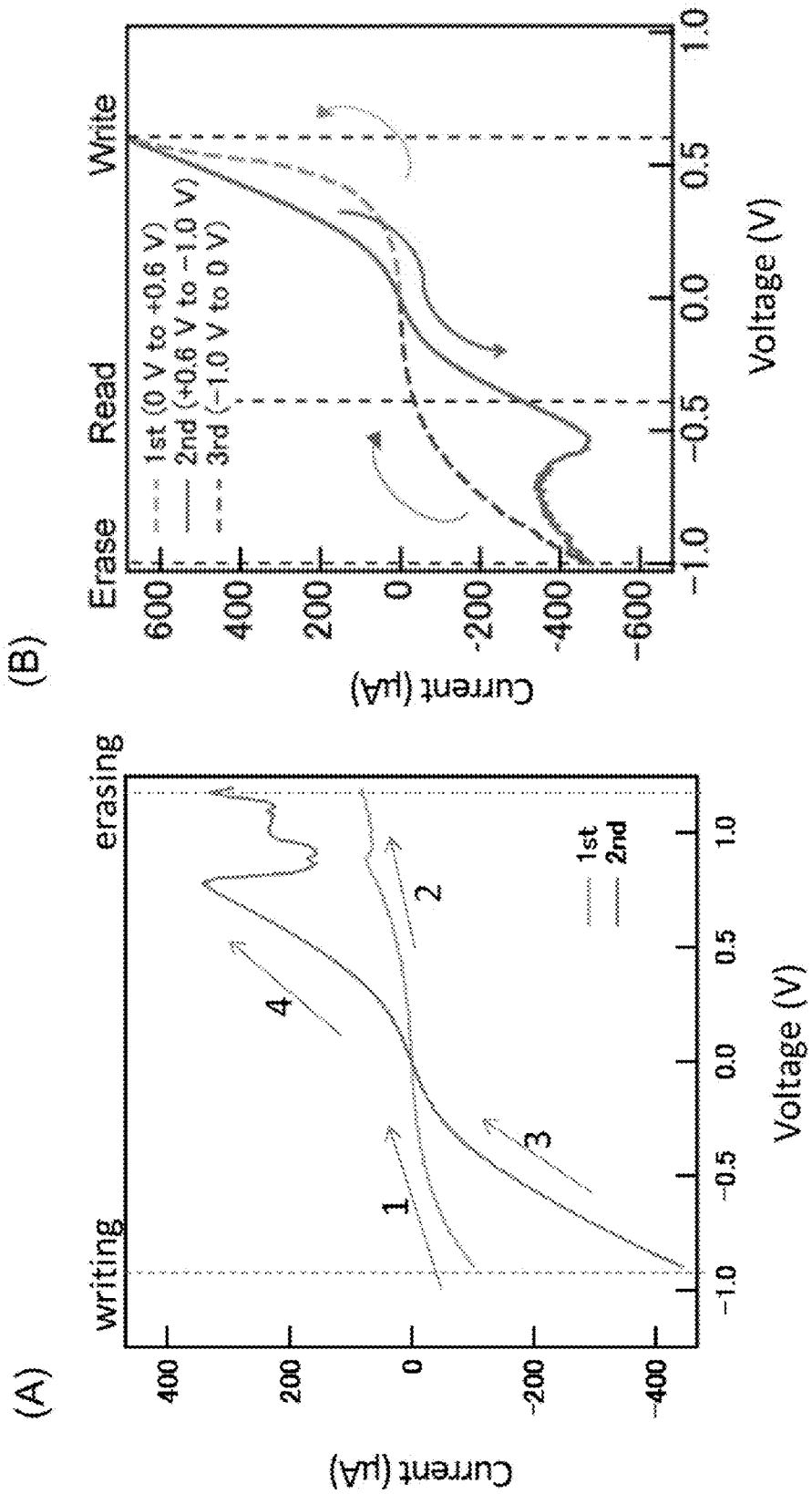
FIG. 27 is a chart showing the current-voltage characteristics obtained when voltage is swept in positive and negative bias directions for a sample fabricated as a reference, where (A) is a chart showing the result of a first measurement, and (B) is a chart showing the results of second and subsequent measurements.
Figure 28:
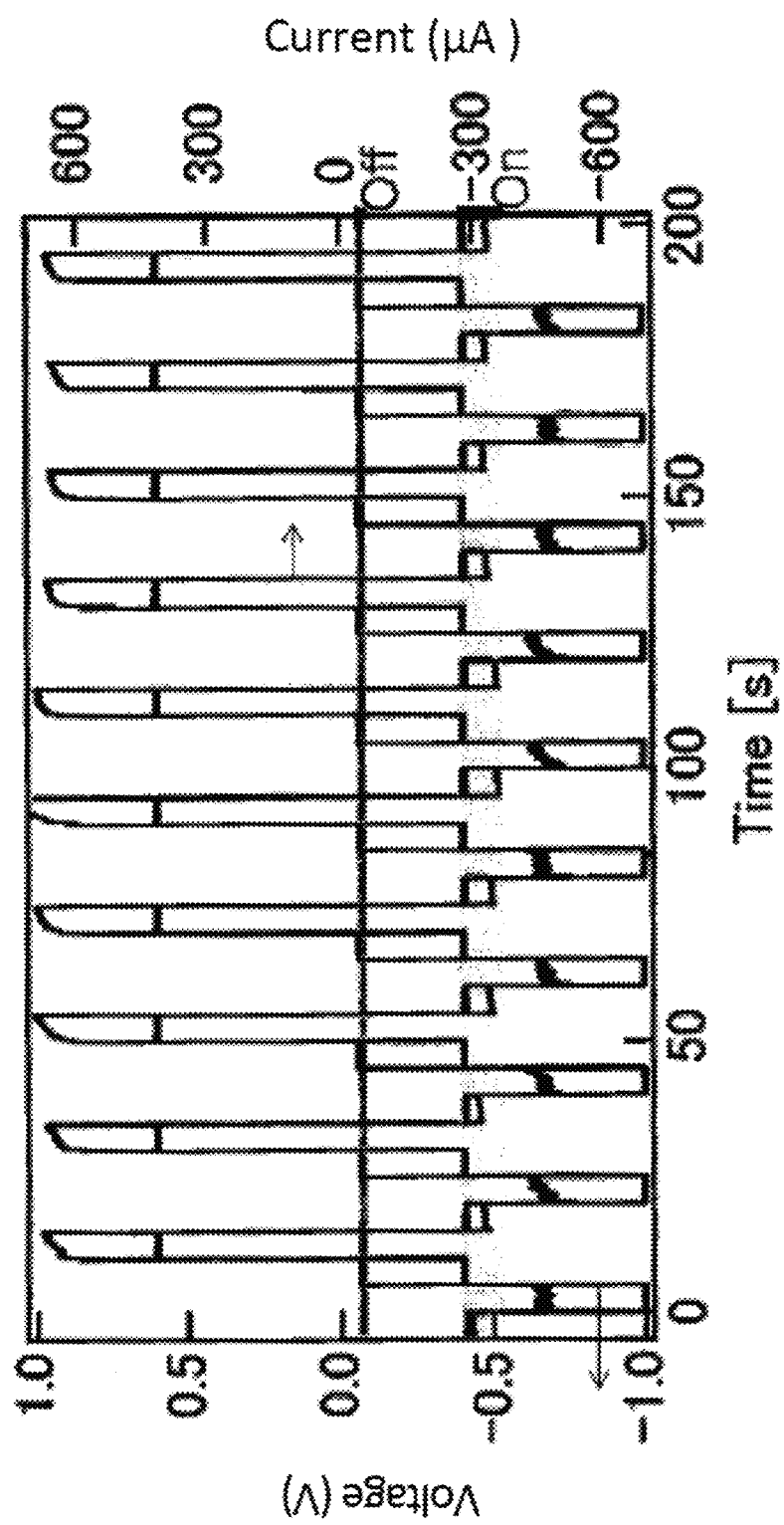
FIG. 28 is a chart showing the current characteristics obtained when a pulse train per 5 second of write voltage, read voltage, erase voltage, and read voltage (20 second cycle, correspondence to 50 mHz frequency) was applied in the sample fabricated as a reference example at room temperature and in the air.

FIG. 27 is a chart showing the current-voltage characteristics obtained when voltage is swept in positive and negative bias directions for a sample fabricated as a reference, where (A) is a chart showing the result of a first measurement, and (B) is a chart showing the results of second and subsequent measurements. The horizontal axis represents voltage (V) and the vertical axis represents current (µA) in both charts. In the second and subsequent measurements, conductance was found to have changed from high to low state. Current response exhibited apparent hysteresis containing varied conditions at −0.5 V. It was found that write voltage, read voltage and erase voltage should be respectively set at +0.6 V, −0.4 V, and −1.0 V in order to observe switching operations. FIG. 28 is a chart showing the current characteristics obtained when a pulse train per 5 second of write voltage $V_{write}$=+0.6 V, read voltage $V_{read}$=−0.4 V, erase voltage $V_{erase}$=−1.0 V, and read voltage $V_{read}$=−0.4 V (20 second cycle, correspondence to 50 mHz frequency) was applied to the sample fabricated as a reference example at room temperature and in the air. The horizontal axis represents time (s), left vertical axis represents voltage (V), and right vertical axis represents current (µA). The chart exhibits a memory operation reproducible with a solid-state device, indicating that the sample is operable as a switching element and a memory element at room temperature.

Comparison between Examples 1 and 2 and Comparative Example reveals that similar tendency is obtained qualitatively even if a metal nanoparticle is not arranged between nanogap. Whether a metal nanoparticle exists or not was thus found not to affect element characteristics. Comparison between Examples 1 and 2 and Comparative Example also reveals a feature that the current values are on the same order and 100 µA higher than the value estimated based on the element size and structure. Since the current changed relatively continuously, paths are considered to have been formed in parallel between electrodes.

In the case shown in FIG. 1, a halide ion(s) is provided on one of the electrodes, facing the other electrode. In addition, halide ions may be provided on the surface of both electrodes facing each other, provided that the number of halide ions provided on one of the electrodes differs from that provided on the other.

Example 3

As an example 3, nanogap electrodes are fabricated by using iodide electroless plating method.

First, a substrate having a silicon substrate 1 on which a silicon dioxide film 2 is thoroughly provided is prepared. Then the substrate is coated with resist and a pattern of initial electrodes, metal layers 3A, 3B with 30 nm gap separation, is drawn using the EB lithographic technology. After development, a 2 nm-Ti film is evaporated by EB evaporation and, 10 nm Au is evaporated on the Ti film so that metal layers 3A, 3B, initial gold nanogap electrodes, are fabricated.

Next, an iodide electroless plating solution was then provided. By dissolving gold leaves in an iodine tincture solution, gold is dissolved as $[AuI_4]^-$ ions, and then reduced to $[AuI_2]^-$ ions by adding L(+)-ascorbic acid as a reducing agent. This solution was used as a plating solution. Samples were repeatedly dipped in the plating solution two or more times at room temperature to have a seed electrode layer undergo iodide electroless plating.

Figure 29:
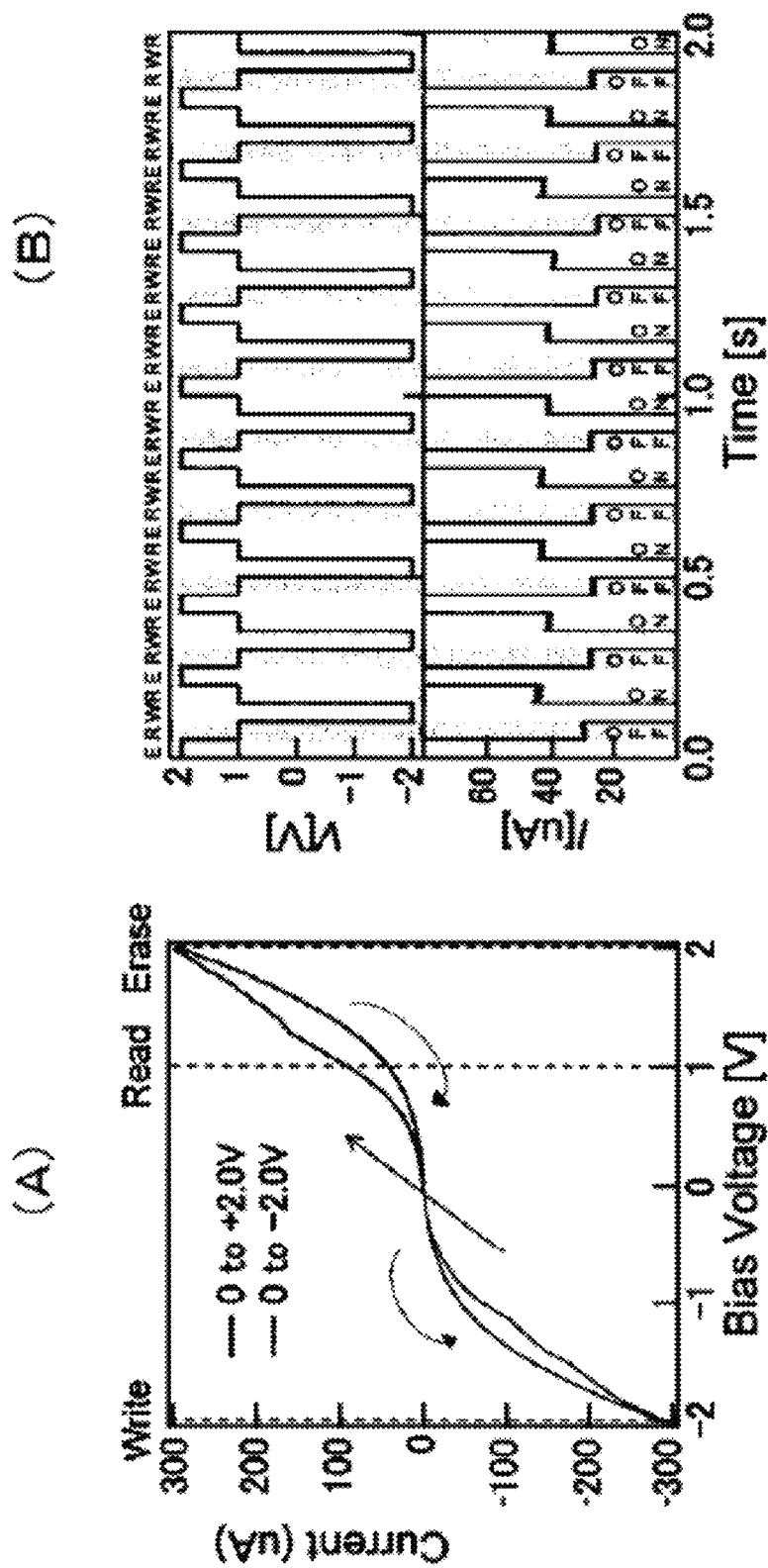
FIG. 29 is a chart showing current-voltage characteristics of nanogap electrodes fabricated by iodide electroless gold plating, where (A) is a chart showing a current-voltage characteristics chart, and (B) is a chart showing the current characteristics obtained when a pulse voltage series is applied.

FIG. 29 shows current-voltage characteristics of nanogap electrodes fabricated by iodide electroless gold plating, where (A) is a current-voltage characteristics chart, and (B) is a chart showing the current Characteristics obtained when a pulse voltage series is applied. The charts show the current-voltage characteristics obtained after forming. When the voltage is continuously swept from 0 V in the positive direction, a shoulder is observed around 1.2 V, and conductance is found to be decreasing. If the voltage is swept in the negative direction from 2 V to 0 V, the current value at the same voltage value becomes smaller and asymmetric, compared to the case where sweeping is performed in the positive direction immediately before. If voltage is swept continuously in the negative direction from 0 V to −2V, the current value increases in the negative direction with the increase of the absolute voltage value. If the voltage is continuously swept in the positive direction from −2 V to 0 V, the absolute current value at the same negative voltage value increases and becomes asymmetric, compared to the case where sweeping is performed in the negative direction immediately before. In other words, continuous voltage sweep from the positive direction to negative direction in the positive voltage range in FIG. 29 exhibits clockwise hysteresis, whereas continuous voltage sweep from negative direction to positive direction in the negative voltage range exhibits counterclockwise hysteresis. This indicates that in the sweep in the positive voltage range, the conductance changes from high state to low state, and that in the sweep in the negative voltage range, the conductance changes from low state to high state. As a result, switching characteristics can be obtained, indicating that this element has polarity. Forming is required to obtain such switching characteristics, and regarding which polarity is to be displayed, either case may be considered.

The present invention is not limited to the Embodiments and Examples, but can be modified in various ways for use within the range of the invention indicated in the scope of the patent claims.

What is claimed is:

1. An electronic element, comprising:
   one electrode and another electrode provided to have a nanogap;
   a halide ion provided between the one electrode and the other electrode and on at least one of the electrodes.

2. The electronic element as set forth in claim 1, wherein a waveform of electric current flowing between the one electrode and the other electrode is asymmetric when voltage between the one electrode and the other electrode is continuously varied from a positive value to a negative value and/or from a negative value to a positive value.

3. The electronic element as set forth in claim 1, wherein current characteristics with respect to voltage between the one electrode and the other electrode have a negative differential conductance.

4. The electronic element as set forth in claim 1, wherein a state of the halide ion is varied in accordance with a value of voltage that is applied between the one electrode and the other electrode so that an information-writing-state and an information-erasing-state are maintained in accordance with a value of electric current that flows between the one electrode and the other electrode.

* * * * *